US011227875B2

(12) United States Patent
Kim et al.

(10) Patent No.: US 11,227,875 B2
(45) Date of Patent: Jan. 18, 2022

(54) DISPLAY DEVICE

(71) Applicant: Samsung Display Co., Ltd., Yongin-si (KR)

(72) Inventors: Myoung Hwa Kim, Seoul (KR); Joon Seok Park, Yongin-si (KR); So Young Koo, Yongin-si (KR); Tae Sang Kim, Seoul (KR); Yeon Keon Moon, Hwaseong-si (KR); Geun Chul Park, Suwon-si (KR); Jun Hyung Lim, Seoul (KR); Kyung Jin Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/836,651

(22) Filed: Mar. 31, 2020

(65) Prior Publication Data

US 2021/0036028 A1 Feb. 4, 2021

(30) Foreign Application Priority Data

Jul. 31, 2019 (KR) .................. 10-2019-0093003

(51) Int. Cl.
*H01L 27/00* (2006.01)
*H01L 29/00* (2006.01)
(Continued)

(52) U.S. Cl.
CPC ........ *H01L 27/1225* (2013.01); *H01L 27/124* (2013.01); *H01L 27/1218* (2013.01);
(Continued)

(58) Field of Classification Search
CPC ............. H01L 27/1225; H01L 27/1288; H01L 27/124; H01L 27/1248; H01L 27/1218;
(Continued)

(56) References Cited

U.S. PATENT DOCUMENTS 7,724,216 B2 * 5/2010 Shin .................... H01L 27/3276
345/76
10,361,290 B2 * 7/2019 Yamazaki ......... H01L 21/02554
(Continued)

FOREIGN PATENT DOCUMENTS

JP 2019-24105 A 2/2019
KR 10-1901251 B1 9/2018

OTHER PUBLICATIONS

Chen, Rongsheng et al., "Self-aligned top-gate InGaZnO thin film transistors using $SiO_2/Al_2O_3$ stack gate dielectric," Thin Solid Films, 548, 2013, pp. 572-575.

*Primary Examiner* — Nikolay K Yushin
(74) *Attorney, Agent, or Firm* — Lewis Roca Rothgerber Christie LLP

(57) ABSTRACT

A display device includes a pixel connected to a scan line, and a data line crossing the scan line, wherein the pixel includes a light-emitting element, a driving transistor configured to control a driving current supplied to the light-emitting element according to a data voltage applied from the data line, and a first switching transistor configured to apply the data voltage of the data line to the driving transistor according to a scan signal that is applied to the scan line. The driving transistor includes a first active layer including an oxide semiconductor, and a first oxide layer disposed on the first active layer and including an oxide semiconductor. The first switching transistor includes a second active layer including an oxide semiconductor, and the first oxide layer is not disposed on the second active layer.

20 Claims, 32 Drawing Sheets

(51) Int. Cl.
*H01L 27/12* (2006.01)
*H01L 29/24* (2006.01)
*H01L 29/786* (2006.01)
*H01L 29/66* (2006.01)
*G09G 3/32* (2016.01)
*H01L 27/32* (2006.01)

(52) U.S. Cl.
CPC ...... *H01L 27/1248* (2013.01); *H01L 27/1288* (2013.01); *H01L 29/24* (2013.01); *H01L 29/66969* (2013.01); *H01L 29/7869* (2013.01); *H01L 29/78633* (2013.01); *G09G 3/32* (2013.01); *G09G 2300/0809* (2013.01); *H01L 27/3258* (2013.01); *H01L 27/3262* (2013.01); *H01L 27/3276* (2013.01); *H01L 2227/323* (2013.01)

(58) Field of Classification Search
CPC ............. H01L 27/3276; H01L 27/3258; H01L 27/3262; H01L 29/24; H01L 29/78633; H01L 29/7869; H01L 29/66969; H01L 2227/323; G09G 3/3258; G09G 3/32; G09G 3/3233; G09G 3/3291; G09G 3/3266; G09G 2300/0809; G09G 2330/12; G09G 2300/0426
See application file for complete search history.

(56) References Cited

U.S. PATENT DOCUMENTS

| | | | |
|---|---|---|---|
| 10,403,757 B2* | 9/2019 | Zhou | H01L 27/3244 |
| 2006/0202934 A1* | 9/2006 | Shin | H01L 27/3276 |
| | | | 345/95 |
| 2015/0263141 A1* | 9/2015 | Yamazaki | H01L 21/02326 |
| | | | 438/104 |
| 2019/0172954 A1* | 6/2019 | Zhou | H01L 29/78633 |

* cited by examiner

DRT : 310, 330, 340, 350, 370
SCT : 410, 430, 440, 450

DRT : 310, 330, 340, 350, 360, 370
SCT : 410, 430, 440, 450

DRT : 310, 330, 340, 350, 360, 370
SCT : 410, 430, 440, 450

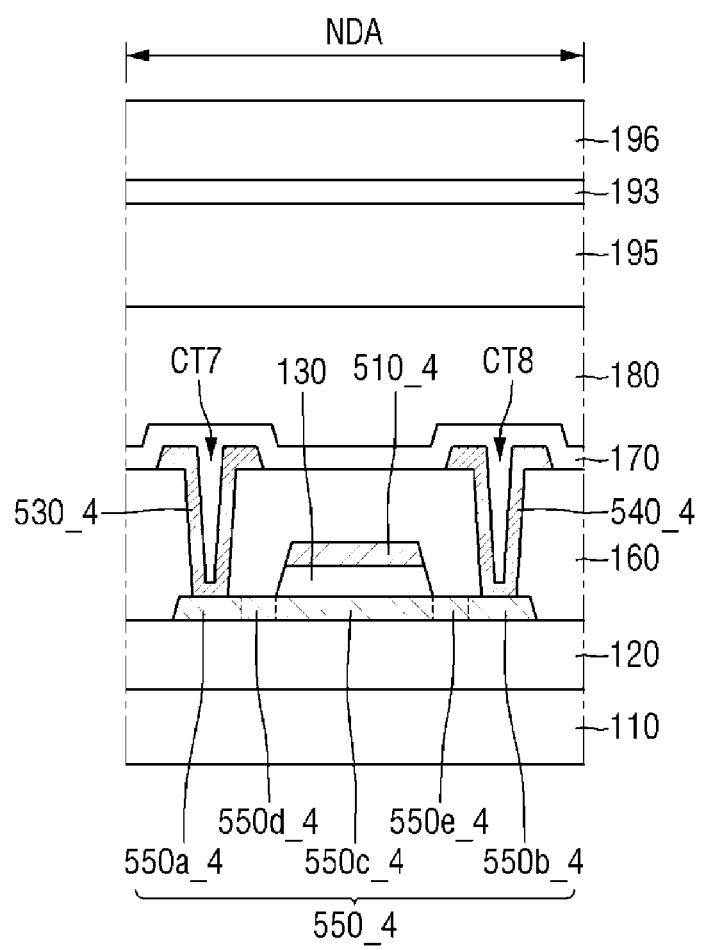

DISPLAY DEVICE

CROSS-REFERENCE TO RELATED APPLICATION

This application claims priority to and the benefit of Korean Patent Application No. 10-2019-0093003, filed on Jul. 31, 2019 in the Korean Intellectual Property Office, the entire content of which is herein incorporated by reference.

BACKGROUND

1. Field

One or more aspects of embodiments of the present disclosure are related to a display device, and more particularly, to a display device including a thin film transistor with an oxide layer.

2. Description of the Related Art

The importance of display devices has increased with the development of multimedia. Accordingly, various suitable display devices such as an organic light-emitting display (OLED) and a liquid crystal display (LCD) have been used.

Devices for displaying an image in display devices include display panels such as an OLED panel and an LCD panel. The display devices may include a light-emitting element as a light-emitting display panel. Examples of a light-emitting diode (LED) include an organic LED that uses an organic material as a fluorescent material, and an inorganic LED that uses an inorganic material as a fluorescent material.

An example display device includes a display panel, a gate driving circuit, a data driving circuit, and a timing controller. The display panel includes data lines, gate lines, and pixels formed at intersections (crossings) of the data lines and the gate lines. Each of the pixels uses a thin film transistor as a switching device, and receives a data voltage from the data line when a gate signal is supplied to the gate line. Each of the pixels may emit light at a set or predetermined brightness, according to the data voltage applied to the pixel.

Recently, display devices capable of displaying an image at a high resolution, for example, in ultra-high definition (UHD), have been released, and display devices capable of displaying an image at a high resolution of 8K UHD have been developed. UHD represents a resolution of 3840×2160, and 8K UHD represents a resolution of 7680×4320.

In a high-resolution display device, a driving current to each of pixels may be reduced as the number of pixels increases, thereby reducing a driving voltage range of a driving transistor of each of the pixels.

SUMMARY

One or more aspects of embodiments of the present disclosure are directed toward a display device including a driving transistor that includes an oxide layer with an active layer and an oxide semiconductor, and a switching transistor that does not include the (an) oxide layer.

It should be noted that objects of the present disclosure are not limited to the above-described objects, and other objects of the present disclosure will be apparent to those skilled in the art from the following description.

One or more example embodiments of the present disclosure provide a display device including: a pixel connected to a scan line, and a data line intersecting or crossing the scan line, wherein the pixel includes a light-emitting element, a driving transistor configured to control a driving current supplied to the light-emitting element, according to a data voltage that is applied from the data line, and a first switching transistor configured to apply the data voltage of the data line to the driving transistor according to a scan signal applied to the scan line. The driving transistor includes a first active layer including an oxide semiconductor, and a first oxide layer disposed on the first active layer and including an oxide semiconductor, and the first switching transistor includes a second active layer including an oxide semiconductor, where the first oxide layer is not disposed on the second active layer.

In an example embodiment, the oxide semiconductor of the first active layer and the oxide semiconductor of the second active layer may include at least one selected from indium (In), gallium (Ga), zinc (Zn), tin (Sn), and hafnium (Hf).

In an example embodiment, the oxide semiconductor of the first oxide layer may include at least one selected from indium (In), gallium (Ga), zinc (Zn), tin (Sn), and hafnium (Hf).

In an example embodiment, a hydrogen content of the first active layer may be lower than a hydrogen content of the second active layer, and an oxygen content of the first active layer may be higher than an oxygen content of the second active layer.

In an example embodiment, the driving transistor may include a first gate insulating layer disposed on the first active layer, and a first gate electrode disposed on the first gate insulating layer and overlapping the first active layer, where the first oxide layer is disposed between the first gate electrode and the first gate insulating layer.

In an example embodiment, a width of the first oxide layer, which is measured in one direction, may be substantially equal to a width of the first gate electrode, which is measured in the one direction.

In an example embodiment, a width of the first oxide layer, which is measured in one direction, may be smaller than a width of the first gate electrode, which is measured in the one direction, and both side surfaces of the first oxide layer may (e.g., simultaneously) be in contact with the first gate electrode.

In an example embodiment, the first active layer may include a first conductive region, a second conductive region, and a channel region disposed between the first conductive region and the second conductive region, and the first oxide layer may be disposed to overlap the channel region of the first active layer.

In an example embodiment, the driving transistor may include a first source electrode in contact with the first conductive region through a first contact hole that passes through an interlayer insulating layer disposed on the first active layer, and a first drain electrode in contact with the second conductive region through a second contact hole that passes through the interlayer insulating layer.

In an example embodiment, the driving transistor may further include a first light-blocking layer disposed below the first active layer, and the first source electrode may be in contact with the first light-blocking layer.

In an example embodiment, the first gate insulating layer may be disposed on the second active layer, and the first switching transistor may include a second gate electrode which is disposed on the first gate insulating layer overlapping the second active layer.

In an example embodiment, at least a partial region of a lower surface of the first gate electrode may be in contact with the first oxide layer, and a lower surface of the second gate electrode may be not in contact with the first oxide layer.

One or more example embodiments of the present disclosure provide a display device including a substrate including a display area and a non-display area, a buffer layer disposed on the substrate, a first semiconductor layer disposed on the buffer layer and including an oxide semiconductor, wherein the first semiconductor layer includes a first active layer and a second active layer that are disposed in the display area, a gate insulating layer disposed on the first semiconductor layer to cover the first active layer and the second active layer, a second semiconductor layer disposed on the gate insulating layer and including an oxide semiconductor, wherein the second semiconductor layer includes a first oxide layer disposed on the first active layer, a first conductive layer disposed on the second semiconductor layer and including a gate electrode, an interlayer insulating layer disposed on the first conductive layer and covering the gate electrode and a second conductive layer disposed on the interlayer insulating layer and including a source electrode and a drain electrode, wherein the first oxide layer is not disposed on the second active layer.

In an example embodiment, the oxide semiconductor of the first semiconductor layer and the oxide semiconductor of the second semiconductor layer may include at least one of indium (In), gallium (Ga), zinc (Zn), tin (Sn), and hafnium (Hf).

In an example embodiment, the first active layer may be lower in hydrogen content than the second active layer, and the first active layer may be higher in oxygen content of the second active layer.

In an example embodiment, the first conductive layer includes a first gate electrode disposed on the first active layer and including a lower surface which is in contact with the first oxide layer, and a second gate electrode disposed on the second active layer and including a lower surface which is in contact with the gate insulating layer.

In an example embodiment, a width of the first gate electrode, which is measured in one direction, may be at least substantially equal to a width of the first oxide layer, which is measured in the one direction.

In an example embodiment, the second conductive layer includes a first source electrode in contact with one end of the first active layer, a first drain electrode in contact with the opposite end of the first active layer, a second source electrode in contact with one end of the second active layer, and a second drain electrode in contact with the opposite end of the second active layer.

In an example embodiment, the display device may further include a third conductive layer disposed between the substrate and the buffer layer and including a first light-blocking layer overlapping the first active layer, wherein the first source electrode may be in contact with the first light-blocking layer.

In an example embodiment, the third conductive layer may further include a second light-blocking layer overlapping the second active layer, and a second gate electrode in contact with the second light-blocking layer.

BRIEF DESCRIPTION OF THE DRAWINGS

The above and other aspects and features of the present disclosure will become more apparent by describing the following example embodiments thereof in more detail with reference to the attached drawings, in which:

FIG. 32 is a cross-sectional view illustrating a second switching transistor according to another example embodiment.

DETAILED DESCRIPTION

The present disclosure will now be described more fully hereinafter with reference to the accompanying drawings, in which embodiments of the disclosure are shown. This disclosure may, however, be embodied in different forms and should not be construed as being limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. When an element is referred to as being "directly on," "directly connected to," or "directly coupled to" another element, there are no intervening elements present.

The same reference numbers indicate the same components throughout the specification, and redundant descriptions thereof may be omitted.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the term "and/or" includes any and all combinations of one or more of the associated listed items. Further, the use of "may" when describing embodiments of the present disclosure refers to "one or more embodiments of the present disclosure".

Hereinafter, example embodiments will be described with reference to the accompanying drawings.

Figure 1:
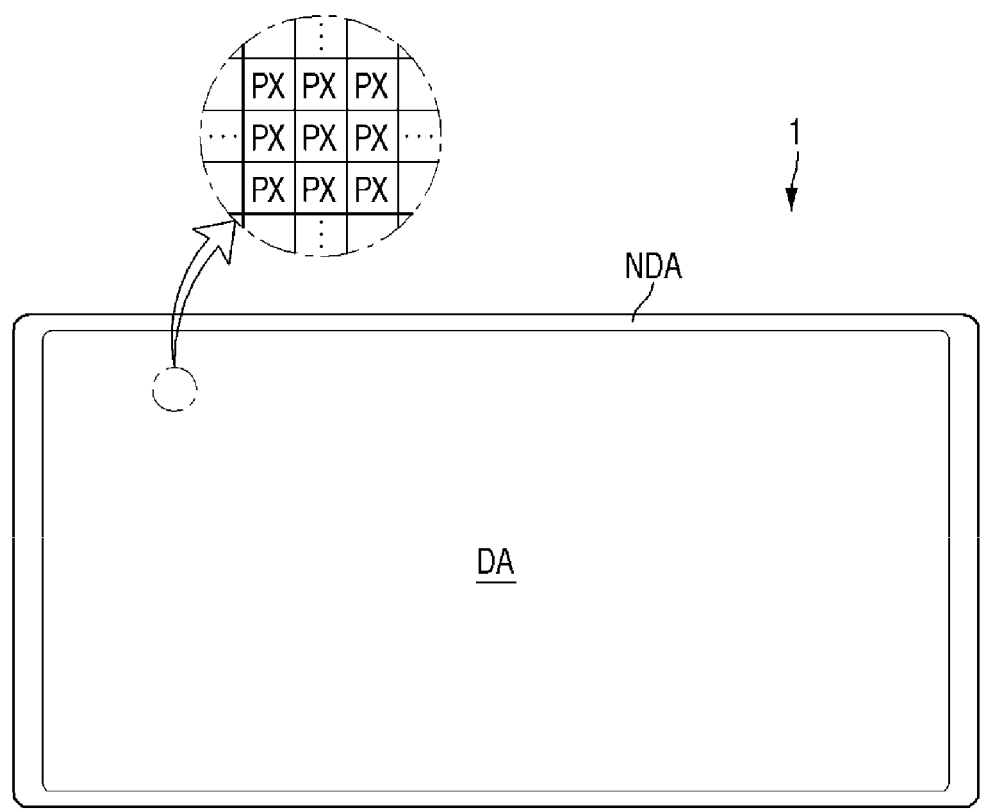
FIG. 1 is a perspective view illustrating a display device according to one example embodiment.

FIG. 1 is a perspective view illustrating a display device according to one example embodiment.

Referring to FIG. 1, a display device 1 displays a moving picture or a still image. The display device 1 may refer to any suitable electronic device that provides a display screen. For example, the display device 1 may include a television, a laptop computer, a monitor, a digital sign, an Internet of things (IoT) device, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation system, a game machine, a digital camera, a camcorder, and/or the like, each including a display screen.

The display device 1 includes a display panel that provides a display screen. Non-limiting examples of the display panel include a light-emitting diode (LED) display panel, an organic light-emitting display (OLED) panel, a quantum dot light-emitting display (QLED) panel, a plasma display panel, a field emission display (FED) panel, and the like. Hereinafter, an embodiments including a LED display panel is illustrated as an example of the display panel, but the present disclosure is not limited thereto, and other display panels may be applied within the same technical spirit.

The display device 1 may be modified to have any suitable shape or form. For example, the display device 1 may have a rectangular shape with a long width, a rectangular shape with a long length, a square shape, a quadrangular shape with one or more rounded corners (vertices), any other polygonal shape, a circular (round) shape, and/or the like. In some embodiments, the shape of a display area DA of the display device 1 may be similar to the overall shape of the display device 1 in FIG. 1. FIG. 1 illustrates an embodiment in which the display device 1 and the display area DA have a rectangular shape with a long width.

The display device 1 may include a display area DA and a non-display area NDA. The display area DA is an area in which an image may be displayed, and the non-display area NDA is an area in which an (the) image is not displayed. The display area DA may also be referred to as an active area, and the non-display area NDA may also be referred to as an inactive area.

In general, the display area DA may occupy a center region or portion of the display device 1. The display area DA may include a plurality of pixels PX. The plurality of pixels PX may be arranged in a matrix form. Each of the pixels PX may have a rectangular shape or a square shape when seen in a plan view, but the present disclosure is not limited thereto, and for example, each of the pixels PX may have a rhombic shape (e.g., in which each side is inclined with respect to a first direction DR1).

Figure 2:
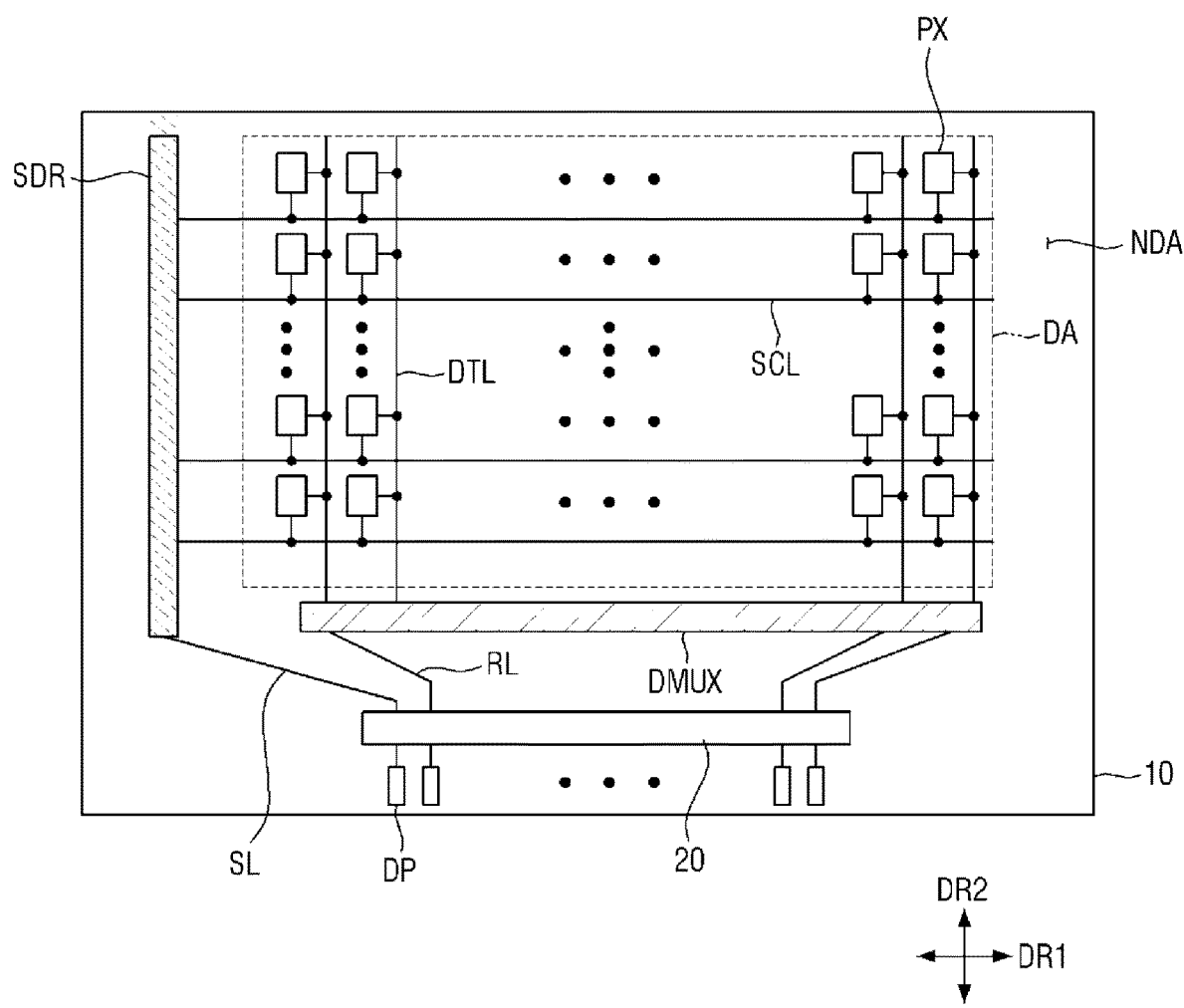
FIG. 2 is a schematic plan view of the display device according to one example embodiment.

FIG. 2 is a schematic plan view of the display device according to one example embodiment.

Referring to FIG. 2, the display device 1 includes a display panel 10, an integrated driver 20, and a scan driver SDR. The integrated driver 20 may include a timing controller and a data driver.

The display panel 10 may include the display area DA in which pixels PX are formed to display an image, and the non-display area NDA peripheral to the display area DA. When the display panel 10 includes a curved portion, the display area DA may be disposed in the curved portion. For example, an image of the display panel 10 may also be viewed on the curved portion.

The pixels PX, as well as scan lines SCL (indexed as SCL1 to SCLk, where k is an integer of 2 or more), data lines DTL (indexed as DTL1 to DTLj, where j is an integer of 2 or more), and power lines, which are connected to the pixels PX, may be disposed in the display area DA. The scan lines SCL may be formed to be parallel to the first direction DR1, and the data lines DTL may be formed to be parallel to a second direction DR2, which intersects the first direction DR1. Each of the pixels PX may be connected to at least one of the scan lines SCL and one of the data lines DTL.

Each of the pixels may include a driving transistor, at least one switching transistor, a light-emitting element, and a capacitor. The switching transistor may be turned on (e.g., may pass current from the source electrode to the drain electrode) when at least one scan signal is applied thereto from the scan line SCL, such that at least one data voltage of the data line DTL is applied to a gate electrode of the driving transistor. The driving transistor supplies a driving current to the light-emitting element according to the data voltage that is applied to the gate electrode, and the light-emitting element may subsequently emit light. The driving transistor and the at least one switching transistor may each be a thin film transistor. The light-emitting element may emit light according to (depending on) the driving current of the driving transistor. The light-emitting element may be formed of an organic light-emitting diode that includes a first electrode, an organic light-emitting layer, and a second electrode. The capacitor may serve to constantly (substantially) maintain the data voltage that is applied to the gate electrode of the driving transistor.

The non-display area NDA may be defined as the area from the outermost portion (perimeter) of the display area DA to the outer edge of the display panel 10. The scan driver SDR (configured to apply the scan signals to the scan lines SCL) and a data voltage distribution circuit DMUX connecting the data lines DTL to the routing lines RL may both (e.g., simultaneously) be disposed in the non-display area NDA. Pads DP electrically connected to the integrated driver 20 may also be disposed in the non-display area NDA. In this case, the integrated driver 20 and the pads DP may be disposed at or near one side edge of the display panel 10.

The integrated driver 20 is connected to the pads DP and receives digital video data and timing signals. The integrated driver 20 converts the digital video data into analog positive/negative data voltages and supplies the analog positive/negative data voltages to the data lines DTL through the routing lines RL and the data voltage distribution circuit DMUX. Further, the integrated driver 20 generates a scan control signal for controlling the scan driver SDR, and supplies the scan control signal through a scan control line SL. The pixels PX to which the data voltages are supplied are selected by the scan signals of the scan driver SDR, and the data voltages are supplied to the selected pixels PX. In some embodiments, the integrated driver 20 may supply power voltages to the power lines.

The integrated driver 20 may be formed of an integrated circuit (IC) and may be mounted on the display panel 10 in a pad area using a chip-on-glass (COG) method, a chip-on-plastic (COP) method, or an ultrasonic bonding method, but the present disclosure is not limited thereto. In some embodiments, for example, the integrated driver 20 may be mounted on a separate circuit board.

The pads DP may be electrically connected to the integrated driver 20. A circuit board may be attached to the pads DP using an anisotropic conductive film. As a result, lead lines of the circuit board may be electrically connected to the pads DP. The circuit board may be a flexible printed circuit board, a printed circuit board, or a flexible film such as a chip-on film. The circuit board may be bent toward a lower portion of the display panel 10. In this case, one side of the circuit board may be attached to one side edge of the display panel 10, and the other side may be disposed on the lower portion of the display panel 10 and connected to a system board on which a host system is mounted.

The scan driver SDR may be connected to the integrated driver 20 through at least one scan control line SL to receive the scan control signal. The scan driver SDR may generate the scan signals according to the scan control signal and sequentially output the scan signals to the scan lines SCL. The scan driver SDR is illustrated in FIG. 2 as being formed at one side of the display area DA, for example, in the non-display area NDA on a left side of the display area DA, but the present disclosure is not limited thereto. For example, the scan driver SDR may be formed at both sides of the display area DA, for example, in the non-display area NDA on the left and right sides of the display area DA.

The data voltage distribution circuit DMUX may be connected between (e.g., may connect) the routing lines RL and the data lines DTL. A ratio of the number of the routing lines RL to the number of the data lines DTL, which are connected to the data voltage distribution circuit DMUX, may be 1:q (where q is an integer greater than or equal to two). The data voltage distribution circuit DMUX may distribute the data voltages, which are applied to one routing line RL, to the plurality of data lines DTL.

A power supply circuit may generate voltages from a main power applied from the system board, which are necessary for driving the display panel 10, and may supply the generated voltages to the display panel 10. For example, the power supply circuit may generate a first power voltage and a second power voltage (which are for driving light-emitting elements EL of the display panel 10) from the main power, and supply the first power voltage and the second power voltage to a first power line VDD (illustrated in FIG. 3) and a second power line VSS (illustrated in FIG. 3) of the display panel 10, respectively. In some embodiments, the power supply circuit may generate driving voltages from the main power for driving the integrated driver 20 and the scan driver SDR, and supply the generated driving voltages to those elements.

The power supply circuit may be formed of an IC and mounted on the circuit board, but the present disclosure is not limited thereto. For example, the power supply circuit may be integrated into the integrated driver 20.

Figure 3:
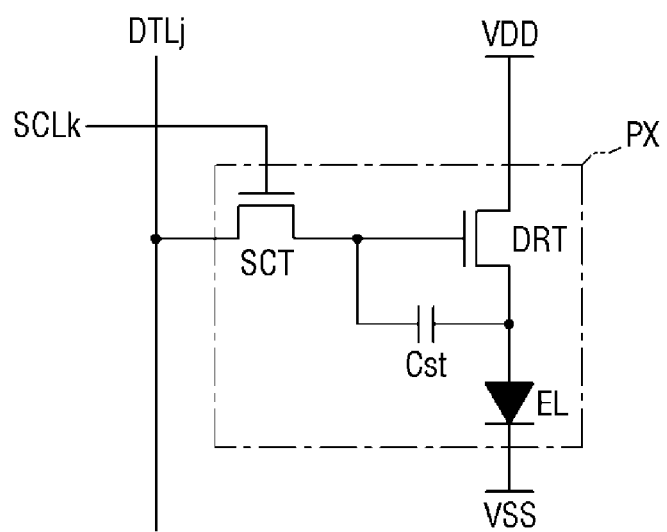
FIG. 3 is a circuit diagram illustrating one pixel of FIG. 2.

FIG. 3 is a circuit diagram illustrating one pixel of FIG. 2.

Referring to FIG. 3, each pixel PX may include a driving transistor DRT, a first switching transistor SCT, a light-emitting element EL, and a capacitor Cst. In FIG. 3, each pixel PX is illustrated as having a 2T1C (2-transistor-1-capacitor) structure that includes one driving transistor DRT, one first switching transistor SCT, and one capacitor Cst, but the present disclosure is not limited thereto. Each pixel PX may include a greater number of transistors and a plurality of capacitors.

Each of the driving transistor DRT and the first switching transistor SCT may include a first electrode, a second electrode, and a gate electrode. One of the first electrode and the second electrode may be a source electrode, and the other one may be a drain electrode.

Each of the driving transistor DRT and the first switching transistor SCT may be formed of (as) a thin film transistor. In FIG. 3, each of the driving transistor DRT and the first switching transistor SCT is illustrated as being formed of (as) an n-type metal oxide semiconductor field effect transistor (MOSFET), but the present disclosure is not limited thereto. The driving transistor DRT and the first switching transistor SCT may be formed of (as) a p-type MOSFET. In this case, the positions of the source electrode and the drain electrode in each of the driving transistor DRT and the first switching transistor SCT may be interchanged. Hereinafter, the case in which the driving transistor DRT and the first switching transistor SCT are both formed of (as) an n-type MOSFET will be described as an example.

The driving transistor DRT supplies a driving current to the light-emitting element EL according to a data voltage that is applied to the gate electrode, so that the light-emitting element may emit light. For example, the driving transistor DRT may act as a driving transistor. The gate electrode of the driving transistor DRT may be connected to the source electrode of the first switching transistor SCT, the source electrode of the driving transistor DRT may be connected to the first electrode of the light-emitting element EL, and the drain electrode of the driving transistor DRT may be connected to the first power line VDD to which the first power voltage is applied.

The first switching transistor SCT may be turned on when a scan signal is applied via the k-th (k is a positive integer) scan line SCLk so that the data voltage of the j-th (j is a positive integer) data line DTLj is applied to the gate electrode of the driving transistor DRT. For example, the first switching transistor SCT may act as a switching transistor. The gate electrode of the first switching transistor SCT may be connected to the k-th scan line SCLk, the source electrode of the first switching transistor SCT may be connected to the gate electrode of the driving transistor DRT, and the drain electrode of the first switching transistor SCT may be connected to the j-th data line DTLj.

The capacitor Cst may be connected between the gate electrode and the source electrode of the driving transistor DRT. As a result, the capacitor Cst may serve to constantly (substantially) maintain the data voltage that is applied to the gate electrode of the driving transistor DRT.

The light-emitting element EL may emit light according to the driving current of the driving transistor DRT. The light-emitting element EL may be formed of an organic light-emitting diode that includes a first electrode, an organic light-emitting layer, and a second electrode. The first electrode of the light-emitting element EL may be connected to the source electrode of the driving transistor DRT, and the second electrode of the light-emitting element EL may be connected to the second power line VSS to which the second power voltage is applied, which is lower than the first power voltage FIG. 4 is a circuit diagram illustrating one pixel of FIG. 2.

Figure 4:
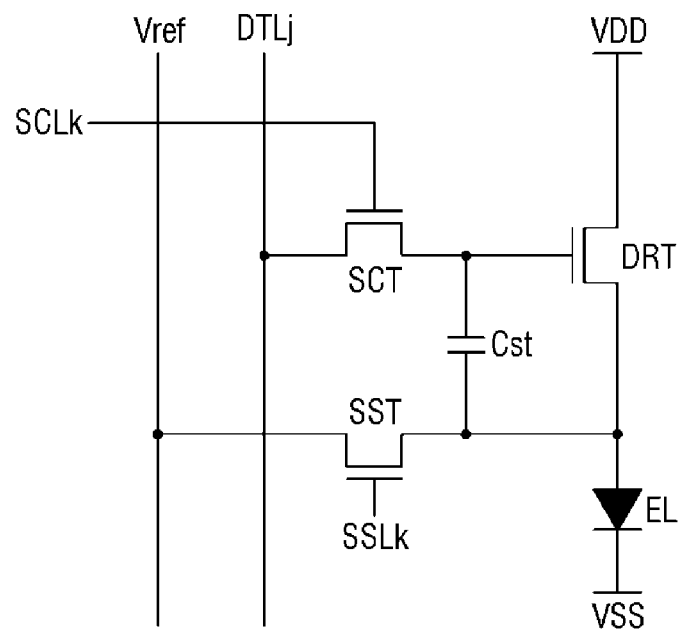
FIG. 4 is a circuit diagram illustrating one pixel of FIG. 2.

Referring to FIG. 4, each pixel PX may include a driving transistor DRT, a first switching transistor SCT, a sensing transistor SST, a light-emitting element EL, and a capacitor Cst. In FIG. 4, each pixel PX is illustrated as having a 3T1C (3-transistor-1-capacitor) structure that includes one driving transistor DRT, one first switching transistor SCT, one sensing transistor SST, and one capacitor Cst, but the present disclosure is not limited thereto. The circuit diagram of FIG. 4 is the same as the circuit diagram of FIG. 3 except that the circuit diagram of FIG. 4 further includes the sensing transistor SST and a reference line Vref as compared to the circuit diagram of FIG. 3.

The circuit diagram of FIG. 4 may further include a compensation circuit that includes the sensing transistor SST and the reference line Vref. The compensation circuit is a circuit added to each pixel PX to compensate for a threshold voltage and/or the like of the driving transistor DRT.

The sensing transistor SST may be connected between a source electrode of the driving transistor DRT and a first electrode of the light-emitting element EL. A gate electrode of the sensing transistor SST may be connected to a k-th sensing signal line SSLk, a drain electrode of the sensing transistor SST may be connected to the reference line Vref, and a source electrode of the sensing transistor SST may be connected to one end of the capacitor Cst. The sensing transistor SST may be turned on by a sensing signal of the k-th sensing signal line SSLk and may supply a reference voltage transmitted through the reference line Vref to the source electrode of the driving transistor DRT, or may sense a voltage or current of the source electrode of the driving transistor DRT.

The reference line Vref may be connected to the scan driver SDR. In this case, the scan driver SDR may sense the source electrode of the driving transistor DRT of each pixel PX in real time for a non-display period or an N frame period of an image, and generate a sensing result. Meanwhile, the first switching transistor SCT (which acts as a switching transistor), and the sensing transistor SST (which acts as a sensing transistor), may be turned on at the same time. In this case, a sensing operation and a data output operation (in which a data signal is output) in the reference line Vref are divided into each other by a time division method of the scan driver SDR.

The sensing result may facilitate compensation for an object such as a digital data signal, an analog data signal, a gamma signal, etc. The compensation circuit that generates a compensation signal and/or the like based on the sensing result may be implemented in the scan driver SDR or in the timing controller, or as a separate circuit.

However, the present disclosure is not limited thereto. In FIGS. 3 and 4, pixels PX having the 2T1C structure and the 3T1C structure, respectively, have been described as examples, but other embodiments of the present disclosure may include a greater number of transistors or capacitors.

Hereinafter, the structure and arrangement of transistors disposed in each pixel PX will be described.

Figure 5:
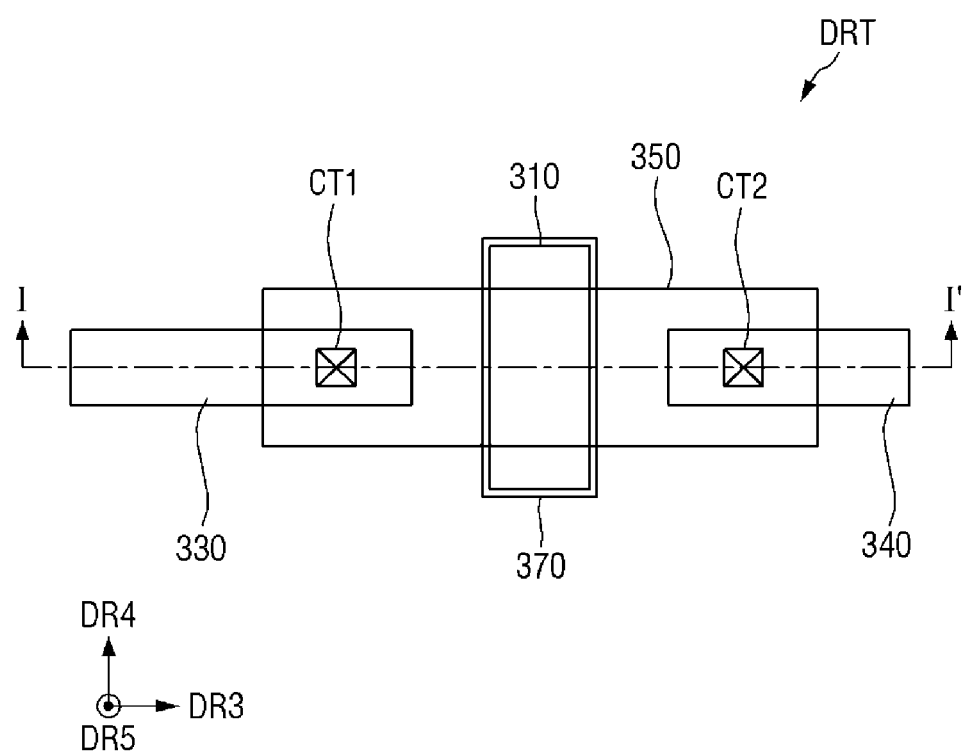
FIG. 5 is a plan view illustrating a driving transistor according to one example embodiment.
Figure 6:
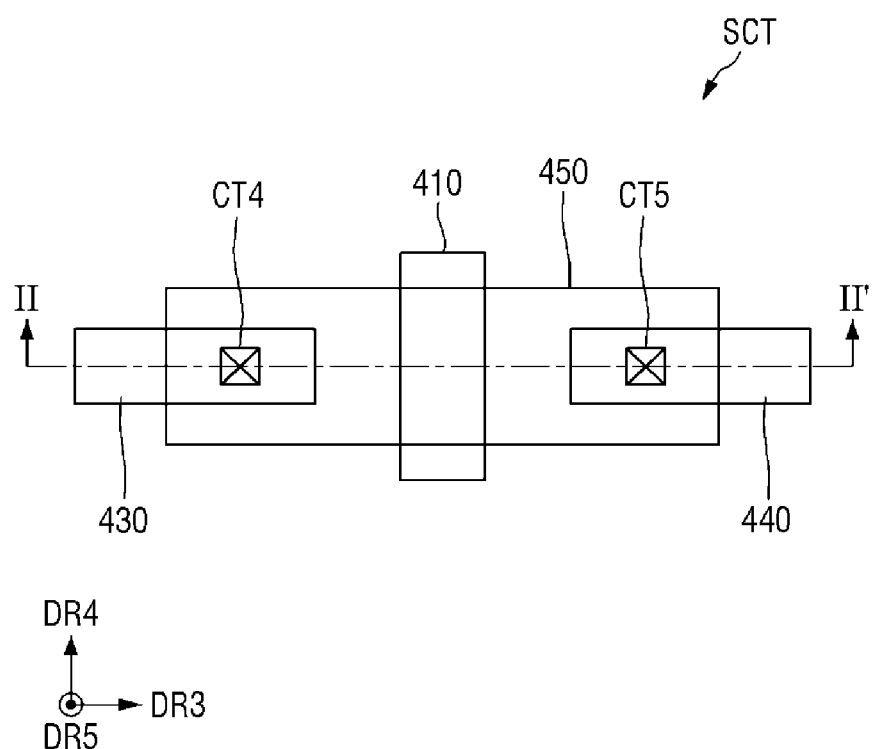
FIG. 6 is a plan view illustrating a first switching transistor according to one example embodiment.
Figure 7:
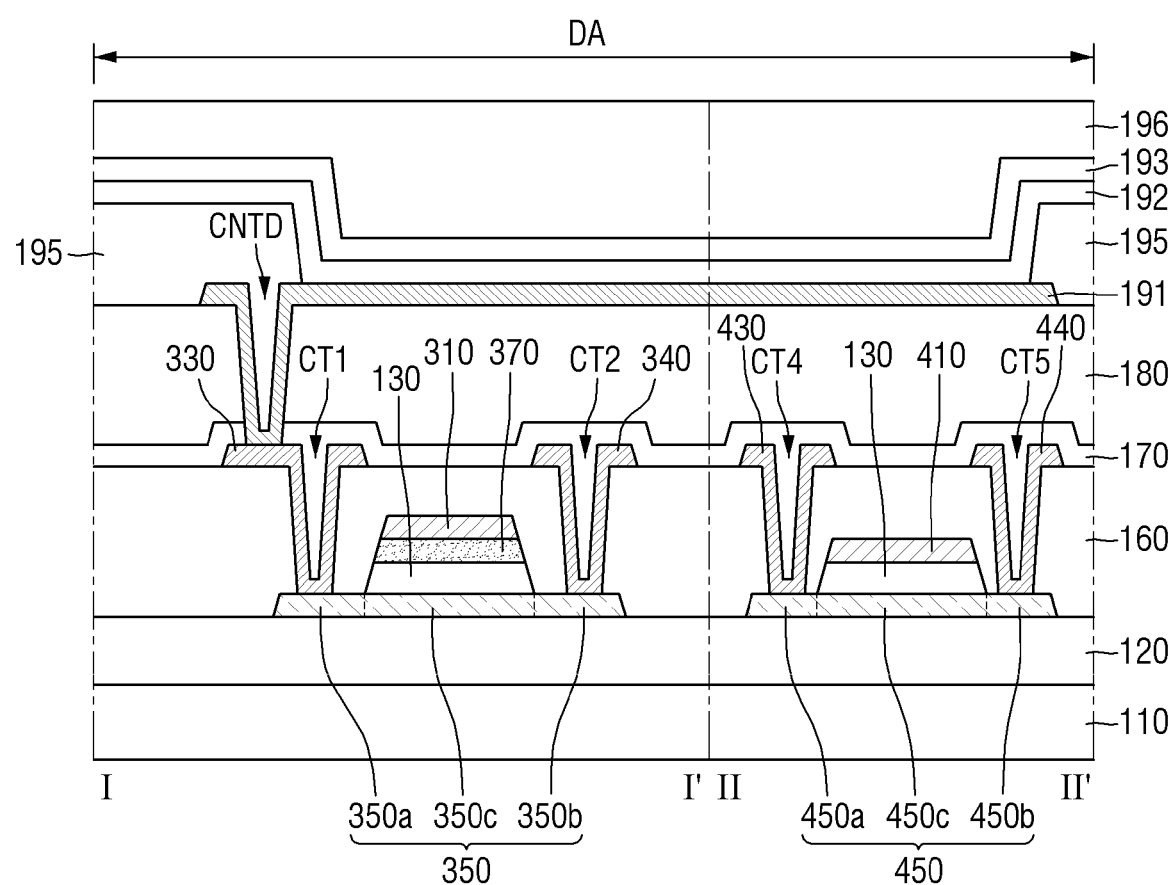
FIG. 7 is a cross-sectional view taken along line I-I' of FIG. 5 and line II-II' of FIG. 6.

FIG. 5 is a plan view illustrating a driving transistor according to one example embodiment. FIG. 6 is a plan view illustrating a first switching transistor according to one example embodiment. FIG. 7 is a cross-sectional view taken along line I-I' of FIG. 5 and line II-II' of FIG. 6.

Referring to FIGS. 5 to 7, the display panel 10 may include a plurality of conductive layers and a plurality of semiconductor layers. The display panel 10 may include a first substrate 110, a buffer layer 120, a first gate insulating layer 130, a driving transistor DRT, a first switching transistor SCT, a first interlayer insulating layer 160, a first protective film 170, a first planarizing film 180, a first electrode 191, an organic light-emitting layer 192, a second electrode 193, a pixel definition film 195, and an encapsulation layer 196.

In FIGS. 5 to 7, the driving transistor DRT and the first switching transistor SCT of the pixel PX are illustrated as having a coplanar structure (e.g., being positioned on the same plane). The coplanar structure has a top-gate structure, in which a (each) gate electrode is formed above an (each) active layer (e.g., in a plane above the layer or plane containing the source and drain electrodes). However, the present disclosure is not limited thereto, and the driving transistor DRT and the first switching transistor SCT of each pixel PX may have a bottom gate structure in which a gate electrode is formed below an active layer. Hereinafter, the driving transistor DRT and the first switching transistor SCT will be described in more detail.

According to one example embodiment, the plurality of pixels PX are disposed in the display area DA of the display panel 10, and each of the pixels PX may include the driving transistor DRT and the first switching transistor SCT. The driving transistor DRT of each pixel PX includes a first active layer 350, a first oxide layer 370, a first gate electrode 310, a first source electrode 330, and a first drain electrode 340. The first switching transistor SCT of the pixel PX includes a second active layer 450, a second gate electrode 410, a second source electrode 430, and a second drain electrode 440.

The display device 1 may include a first semiconductor layer and a second semiconductor layer, each having an oxide semiconductor. The first semiconductor layer may include the first active layer 350 and the second active layer 450, and the second semiconductor layer may include the first oxide layer 370. The first oxide layer 370 may include an oxide semiconductor different from those of the first active layer 350 and the second active layer 450, and may be selectively disposed only on the first active layer 350. Hereinafter, a plurality of members of the display device 1 will be described in more detail.

The first substrate 110 may provide a region in which the driving transistor DRT and the first switching transistor SCT are formed. The first substrate 110 may be made of plastic and/or glass.

The buffer layer 120 is disposed on the first substrate 110. The buffer layer 120 may protect the driving transistor DRT and the first switching transistor SCT of the pixel PX from moisture that penetrates through the first substrate 110. The buffer layer 120 may be formed of a plurality of inorganic layers that are alternately stacked. For example, the buffer layer 120 may be formed as a multi-layer structure in which one or more inorganic layers of a silicon oxide layer (SiOx), a silicon nitride layer (SiNx), and a silicon oxynitride (SiON) are alternatingly stacked.

Meanwhile, in some example embodiments, a conductive layer may be further disposed between the first substrate 110 and the buffer layer 120 of the display device 1. The conductive layer may include a light-blocking layer disposed to overlap the first active layer 350 of the driving transistor DRT and the second active layer 450 of the first switching transistor SCT, which will be described below. This will also be described in more detail below with reference to other example embodiments.

The first semiconductor layer with an oxide semiconductor is disposed on the buffer layer 120. The first semiconductor layer may include the first active layer 350 of the driving transistor DRT and the second active layer 450 of the first switching transistor SCT.

The first active layer 350 and the second active layer 450 may each be disposed on the buffer layer 120. According to one example embodiment, the first active layer 350 and the second active layer 450 may include an oxide semiconductor. In the example embodiment, the first active layer 350 and the second active layer 450 may each independently include indium-tin oxide (ITO), indium-tin-gallium oxide (ITGO), indium-gallium-zinc oxide (IGZO), or indium-gallium-zinc-tin oxide (IGZTO). However, the present disclosure is not limited thereto.

The first active layer 350 and the second active layer 450 may be formed of substantially the same material, and may have different compositions due to deposition of an oxide layer, thereon (e.g., as present on the first active layer 350 but not the second active layer 450), as described below. The first oxide layer 370 including an oxide semiconductor may be disposed on the first active layer 350, while the first oxide layer 370 may not be disposed on the second active layer 450. The first oxide layer 370 may act as an oxygen supply layer that injects oxygen into the first active layer 350 during a manufacturing process of the display device 1. The oxygen content of the first active layer 350 may be different from the oxygen content of the second active layer 450 in the finally manufactured display device 1. The descriptions thereof will be given below.

The first active layer 350 and the second active layer 450 may include first conductive regions 350a and 450a, second conductive regions 350b and 450b, and channel regions 350c and 450c, respectively. The channel regions 350c and 450c may be disposed between the first conductive regions 350a and 450a and the second conductive regions 350b and 450b, respectively. The first conductive regions 350a and 450a and the second conductive regions 350b and 450b may be in contact with the source electrodes 330 and 430 and the drain electrodes 340 and 440, respectively, which will be described below.

The first gate insulating layer 130 is disposed on the first semiconductor layer. The first gate insulating layer 130 is disposed on the first active layer 350 and the second active layer 450. The first gate insulating layer 130 may be formed of an inorganic material such as silicon oxide (SiOx), silicon nitride (SiNx), or a stacked structure thereof.

Meanwhile, the first gate insulating layer 130 is illustrated in the drawing as being disposed only between the first gate electrode 310 and the first active layer 350 and between the second gate electrode 410 and the second active layer 450, but the present disclosure is not limited thereto. For example, the first gate insulating layer 130 may be formed on upper and side surfaces of the first active layer 350 and on upper and side surfaces of the second active layer 450, and in some embodiments may be disposed on an entire surface of the buffer layer 120.

The second semiconductor layer including an oxide semiconductor may be disposed on the first gate insulating layer 130. According to one example embodiment, the second semiconductor layer may include the first oxide layer 370 that is disposed on the first active layer 350.

The second semiconductor layer may include an oxide semiconductor, and the driving transistor DRT according to one example embodiment may include the first active layer 350 and the first oxide layer 370 having an oxide semiconductor. The oxide semiconductor of the second semiconductor layer and the oxide semiconductor of the first semiconductor layer may be the same material, but are not limited thereto, and in some embodiments may be different oxide semiconductor materials. The first oxide layer 370 of the driving transistor DRT may be disposed on the first gate insulating layer 130 to overlap the first active layer 350. The first oxide layer 370 is disposed to overlap at least the channel region 350c of the first active layer 350, and in some embodiments, a width of the first oxide layer 370, which is measured in one direction, may be smaller than a width of the first active layer 350, which is measured in the one direction, but may be larger than a width of the channel region 350c of the first active layer 350, which is measured in the one direction. In the drawing, the width of the first oxide layer 370 is illustrated as being substantially equal to or only slightly smaller than that of the channel region 350c of the first active layer 350, but the present disclosure is not limited thereto.

According to one example embodiment, the first oxide layer 370 may act as an oxygen supply layer to inject oxygen (O) into the channel region 350c of the first active layer 350. An oxygen vacancy region Vo may be partially formed in the oxide semiconductor according to the oxygen partial pressure provided in a deposition process. When the insulating layer is deposited on the oxide semiconductor, hydrogen (H) may be injected into the oxygen vacancy region Vo, which may increase the mobility of the oxide semiconductor. The number of oxygen vacancy regions Vo may be large so that the active layer that has the oxide semiconductor may have high mobility. However, in this case, due to an excessive carrier concentration, it may be difficult for the driving transistor DRT to secure a driving voltage for driving each pixel PX.

The oxide layer may supply excess oxygen (O) to another adjacent layer, for example, an insulating layer. The excess oxygen (O) that is supplied to the insulating layer may be subsequently injected into the channel region of the oxide semiconductor, and the hydrogen (H) that was penetrated into the oxygen vacancy region Vo may be discharged back to the insulating layer. In this case, the number of carriers contained in the oxide semiconductor may be reduced, and the driving voltage range of the driving transistor DRT may be secured or suitably maintained. In contrast, in the case of the first switching transistor SCT, the oxygen supply (oxide) layer is not disposed on the active layer so that the first switching transistor SCT may have high mobility.

According to one example embodiment, the driving transistor DRT may include the first oxide layer 370 disposed on the first active layer 350, thereby improving device characteristics. The driving transistor DRT, which includes the first oxide layer 370, may have a relatively small curve slope in a driving voltage-driving current graph, thereby securing a wide range of driving voltages to drive the light-emitting element EL of the pixel PX. Furthermore, in the first switching transistor SCT, the second gate electrode 410 is disposed on the second active layer 450 without having an oxide layer that is disposed on the second active layer 450 so that high mobility of electrons may be secured in the channel region 450c.

Figure 8:
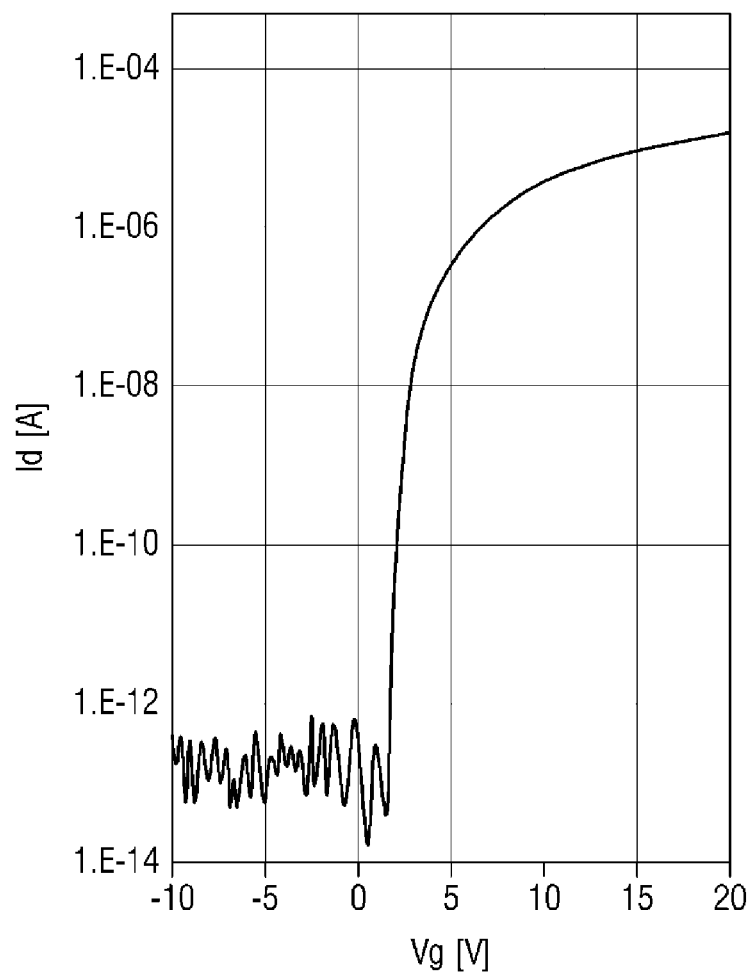
FIG. 8 is a graph illustrating a driving current according to a gate voltage of the driving transistor according to one example embodiment.
Figure 9:
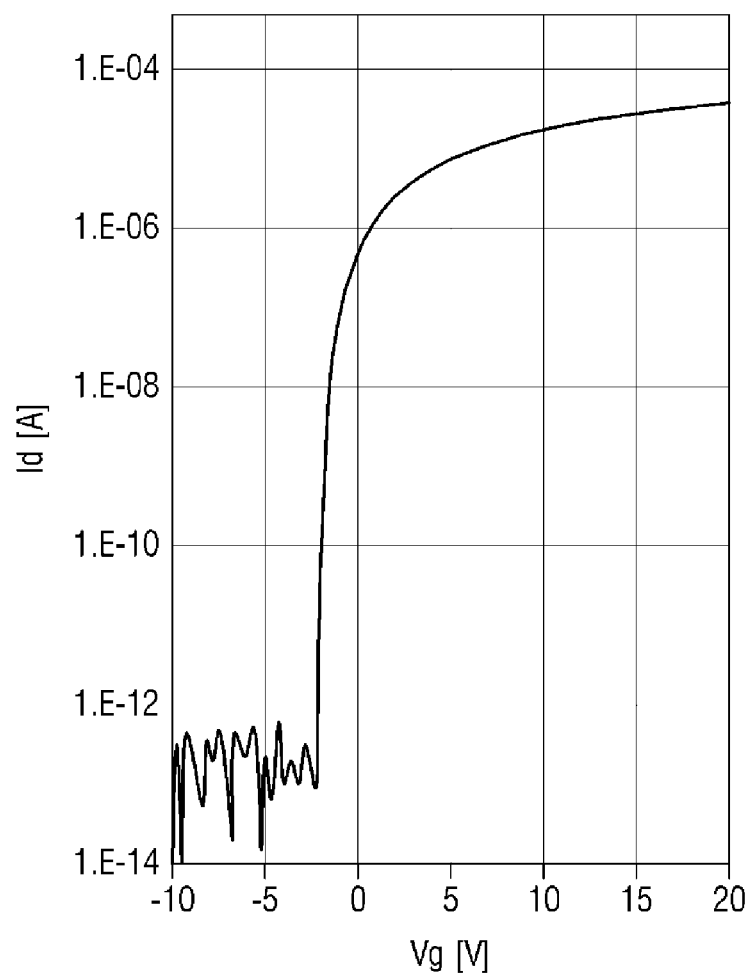
FIG. 9 is a graph illustrating a driving current according to a gate voltage of the switching transistor according to one example embodiment.

FIG. 8 is a graph illustrating the relationship between driving current and gate voltage of the driving transistor according to one example embodiment. FIG. 9 is a graph illustrating the relationship between driving current and gate voltage of the switching transistor according to one example embodiment. For example, FIG. 8 is a graph illustrating the driving current (Id) according to the gate voltage (Vg) of the driving transistor DRT, which includes the first oxide layer 370, according to one example embodiment. For example, FIG. 9 is a graph illustrating the driving current (Id) according to the gate voltage (Vg) of the first switching transistor SCT, in which the first oxide layer 370 is not disposed, according to one example embodiment.

As shown in FIG. 8, when the driving transistor additionally includes the oxide layer, the slope of the curve in the graph of the driving current (Id) according to the gate voltage (Vg) may have a gentle shape (e.g., a relative gradual decrease in dy/dx in the shoulder region of the plotted curve). Accordingly, in the driving transistor DRT, a range of the gate voltage (Vg), which is required for a set or predetermined range of driving current (Id), may be widened. For example, the driving transistor DRT according to one example embodiment may secure a wide range of driving voltages for driving the pixel PX. In particular, in order for the display device 1 to realize the display device 1 of high resolution by having a greater number of pixels PX, the width of the channel region 350c of the driving transistor DRT may be narrowed. The driving transistor DRT according to one example embodiment may secure a wide range of driving voltages even with a narrow channel region 350c when the driving transistor DRT includes the first oxide layer 370.

Meanwhile (simultaneously), as shown in FIG. 9, in the case of the switching transistor that does not include the oxide layer, the slope of the curve may be relatively large and the curve may have a steeper shape (e.g., in the shoulder region) than the curve of FIG. 8. The active layer of the switching transistor may have high electron mobility in the channel region and may exhibit a high response speed when the gate voltage (V) is applied.

The first oxide layer 370 according to one example embodiment may include an oxide containing at least one of indium (In), gallium (Ga), zinc (Zn), tin (Sn), and hafnium (Hf). In some example embodiments, the first oxide layer 370 may be formed of tin-zinc oxide (TZO), tin-gallium oxide (TGO), indium-tin-zinc oxide (ITZO), indium-tin-gallium oxide (ITGO), or indium-tin-zinc-gallium oxide (ITZGO). However, the present disclosure is not limited thereto.

The first oxide layer 370 may be formed to overlap at least the channel region 350c of the first active layer 350 to allow the excess oxygen (O) to be injected into the channel region 350c of the first active layer 350. In some embodiments, the first oxide layer 370 disposed on the first gate insulating layer 130 may have a width larger than that of the channel region 350c of the first active layer 350 and for example, may overlap the entire region of the channel region 350c. However, the present disclosure is not limited thereto, and the width of the first oxide layer 370 may be substantially equal to the width of the channel region 350c of the first active layer 350.

Meanwhile, according to one example embodiment, the first active layer 350 of the driving transistor DRT and the second active layer 450 of the first switching transistor SCT may have the same oxide semiconductor but different composition ratios. When the first oxide layer 370 is disposed on the first active layer 350, the excess oxygen (O) of the first oxide layer 370 may be injected into the first active layer 350, and the hydrogen (H) present in the oxygen vacancy region Vo may be discharged. Accordingly, the first active layer 350 may have a higher oxygen content than the first oxide layer 370, and the first oxide layer 370 may have a higher hydrogen content than the first active layer 350. However, the present disclosure is not limited thereto.

According to one example embodiment, the first active layer 350 may have a higher content of oxygen (O) than the second active layer 450. In addition, the first active layer 350 may have a lower content of hydrogen (H) than the second active layer 450. The first active layer 350 has the first oxide layer 370 disposed thereabove so that oxygen may be injected therein to and hydrogen may be discharged therefrom during the manufacturing process. On the other hand, because the second active layer 450 does not have the first oxide layer 370 disposed thereon, the second active layer 450 may have almost (substantially) no injection and discharge of oxygen and hydrogen. The first active layer 350 and the second active layer 450 may be formed of the same material during the same process, but may have different compositions according to differential deposition of the first oxide layer 370 in a subsequent process. The driving transistor DRT according to one example embodiment includes the first active layer 350 that has a high content of oxygen (O), thereby securing a wide range of driving voltages. The first switching transistor SCT includes the second active layer 450 that has a high content of hydrogen (H) and thus may have high electron mobility. However, the present disclosure is not limited thereto.

Referring again to FIGS. 5 to 7, a first conductive layer is disposed on the second semiconductor layer. The first conductive layer may include the first gate electrode 310 disposed on the first oxide layer 370, and the second gate electrode 410 disposed on the second active layer 450.

The first gate electrode 310 is disposed on the first oxide layer 370. The first gate electrode 310 may overlap the first active layer 350 with the first oxide layer 370 and the first gate insulating layer 130 interposed therebetween. For example, the first gate electrode 310 may overlap the channel region 350c of the first active layer 350. The second gate electrode 410 is disposed on the first gate insulating layer 130.

The second gate electrode 410 may overlap the second active layer 450 with the first gate insulating layer 130 interposed therebetween. For example, the second gate electrode 410 may overlap the channel region 450c of the second active layer 450.

When the first gate electrode 310 and the second gate electrode 410 have sufficient widths to overlap the channel region 350c of the first active layer 350 and the channel region 450c of the second active layer 450, respectively, the range of widths is not particularly limited. The first gate electrode 310 and the second gate electrode 410 may each be formed as a single layer or multi-layer structure made of one selected from molybdenum (Mo), aluminum (Al), chromium (Cr), gold (Au), titanium (Ti), nickel (Ni), neodymium (Nd), copper (Cu), and alloys thereof.

According to one example embodiment, the first gate electrode 310 of the first conductive layer is disposed on the first oxide layer 370 at a position that overlaps the first active layer 350, and the second gate electrode 410 of the first conductive layer is disposed on the first gate insulating layer 130 at a position that overlaps the second active layer 450. For example, the first conductive layer may include the first gate electrode 310 that has a lower surface in contact with the first oxide layer 370, and the second gate electrode 410 that has a lower surface in contact with the first gate insulating layer 130. As described above, the driving transistor DRT may include the first oxide layer 370 that is disposed between the first active layer 350 and the first gate electrode 310, thereby securing a wide range of driving voltages. In contrast to the driving transistor DRT, in the first switching transistor SCT, the first oxide layer 370 is not disposed between the second active layer 450 and the second gate electrode 410, and a great amount of hydrogen (H) is contained, thereby securing electron mobility.

Further, according to one example embodiment, a width of the first gate electrode 310 may be at least substantially equal to the width of the first oxide layer 370. In FIG. 5, the width of the first gate electrode 310 is illustrated as being smaller than the width of the first oxide layer 370, but in some embodiments the widths of the first gate electrode 310 and the first oxide layer 370 may be substantially the same. As will be described below, the first gate electrode 310 and the first oxide layer 370 may be formed to have the same width by being patterned in the same process. Thus, according to one example embodiment, an upper surface of the first oxide layer 370 may be in contact with the first gate electrode 310, but side surfaces thereof may be exposed without being in contact with the first gate electrode 310. The exposed side surfaces of the first oxide layer 370 may be in contact with the first interlayer insulating layer 160 that will be described below.

However, the present disclosure is not limited thereto, and in some cases, the width of the first gate electrode 310 may be greater than the width of the first oxide layer 370 so that the first gate electrode 310 is disposed to cover the first oxide layer 370. In this case, the side surfaces of the first oxide layer 370 may be in contact with the first gate electrode 310. This will be described in more detail below with reference to other example embodiments.

The first interlayer insulating layer 160 is disposed on the first conductive layer. The first interlayer insulating layer 160 is disposed on the first gate electrode 310 and the second gate electrode 410, and may be formed of an inorganic material such as silicon oxide (SiOx), silicon nitride (SiNx), or a stacked structure thereof.

The first interlayer insulating layer 160 may be formed with (e.g., to include) a first contact hole CT1, which exposes a portion of the upper surface of the first active layer 350 through the first interlayer insulating layer 160, and a second contact hole CT2, which exposes another portion of the upper surface of the first active layer 350 through the first interlayer insulating layer 160. For example, the first contact hole CT1 may be formed to expose the first conductive region 350*a* of the first active layer 350, and the second contact hole CT2 may be formed to expose the second conductive region 350*b* of the first active layer 350.

Further, the first interlayer insulating layer 160 may be formed with (e.g., to include) a fourth contact hole CT4, which exposes a portion of the upper surface of the second active layer 450 through the first interlayer insulating layer 160, and a fifth contact hole CT5, which exposes another portion of the upper surface of the second active layer 450 through the first interlayer insulating layer 160. For example, the fourth contact hole CT4 may be formed to expose the first conductive region 450*a* of the second active layer 450, and the fifth contact hole CT5 may be formed to expose the second conductive region 450*b* of the second active layer 450.

The number of contact holes formed in the first interlayer insulating layer 160 is not limited thereto. In some example embodiments, a greater number of (e.g., additional) contact holes may be formed in the first interlayer insulating layer 160. The descriptions thereof will be given below.

A second conductive layer is disposed on the first interlayer insulating layer 160. The second conductive layer may include the first source electrode 330 and the first drain electrode 340 of the driving transistor DRT, and the second source electrode 430 and the second drain electrode 440 of the first switching transistor SCT.

The first source electrode 330 is in contact with the first conductive region 350*a*, which is formed at one side or end of the first active layer 350, through the first contact hole CT1. The first drain electrode 340 is in contact with the second conductive region 350*b*, which is formed at the opposite side or end of the first active layer 350, through the second contact hole CT2. The second source electrode 430 is in contact with the first conductive region 450*a*, which is formed at one side or end of the second active layer 450, through the fourth contact hole CT4. The second drain electrode 440 is in contact with the second conductive region 450*b*, which is formed at the opposite side or end of the second active layer 450, through the fifth contact hole CT5.

The first protective film 170 is disposed on the second conductive layer. The first protective film 170 is disposed on the first source electrode 330 and the first drain electrode 340 of the driving transistor DRT, and on the second source electrode 430 and the second drain electrode 440 of the first switching transistor SCT. The first protective film 170 may be formed of an inorganic material such as silicon oxide (SiOx), silicon nitride (SiNx), or a stacked structure thereof.

The first planarizing film 180 is disposed on the first protective film 170. The first planarizing film 180 may planarize a step that is caused by a thin film transistor such as the driving transistor DRT and the first switching transistor SCT. The first planarizing film 180 may be formed of an organic film made of an acryl resin, an epoxy resin, a phenolic resin, a polyamide resin, a polyimide resin, or the like.

The pixel definition film 195 and the light-emitting element EL that includes the first electrode 191, the organic light-emitting layer 192, and the second electrode 193 may be formed on the first planarizing film 180.

The first electrode 191 may be formed on the first planarizing film 180. The first electrode 191 may be connected to the first source electrode 330 of the driving transistor DRT through an electrode contact hole CNTD that passes through the first protective film 170 and the first planarizing film 180.

In order to divide (define) pixels, the pixel definition film 195 may be formed on the first planarizing film 180 to cover an edge of the first electrode 191. For example, the pixel definition film 195 acts as a pixel definition film that defines the pixels. Here, each of the pixels represents a region in which the first electrode 191, the organic light-emitting layer 192, and the second electrode 193 are sequentially stacked so that holes from the first electrode 191 and electrons from the second electrode 193 are combined with each other in the organic light-emitting layer 192 to emit light.

The organic light-emitting layer 192 may be disposed on the first electrode 191 and the pixel definition film 195. The organic light-emitting layer 192 may include a hole transporting layer, a light-emitting layer, and an electron transporting layer. In some embodiments, the organic light-emitting layer 192 may be formed to have a tandem structure of two or more stacks. In this case, a charge generation layer may be formed between the stacks. In the drawing, the organic light-emitting layer 192 is illustrated as being formed over the entire display area DA, but the present disclosure is not limited thereto. In some example embodiments, the organic light-emitting layer 192 may be formed only in a partial region corresponding to the first electrode 191 of each pixel PX.

The second electrode 193 may be formed on the organic light-emitting layer 192. The second electrode 193 may be a common layer that is commonly formed in (e.g., common to) the pixels.

The light-emitting elements EL may be formed in a top emission type in which light is emitted upward. In this case, the first electrode 191 may be made of a metallic material that has high reflectivity, and for example, may be a stacked structure (Ti/Al/Ti) of aluminum and titanium, a stacked structure (ITO/Al/ITO) of aluminum and ITO, a silver-palladium-copper (APC) alloy, and a stacked structure (ITO/APC/ITO) of an APC alloy and ITO. The APC alloy is an alloy of silver (Ag), palladium (Pd), and copper (Cu). In some embodiments, the second electrode 193 may be made of a transparent conductive (metallic) material (TCO) that is capable of transmitting light, such as ITO or IZO, or may be made of a semi-transmissive conductive material such as magnesium (Mg), silver (Ag), or an alloy of magnesium (Mg) and silver (Ag). When the second electrode 193 is made of the semi-transmissive conductive (metallic) material, light extraction efficiency may be improved due to a microcavity.

The encapsulation layer 196 configured to prevent or reduce oxygen or moisture from penetrating may be formed on the second electrode 193. The encapsulation layer 196 may include at least one inorganic film. The inorganic film may be made of silicon nitride, aluminum nitride, zirconium nitride, titanium nitride, hafnium nitride, tantalum nitride, silicon oxide, aluminum oxide, or titanium oxide. In some embodiments, the encapsulation layer 196 may include at least one organic film to prevent or reduce particles from penetrating the encapsulation layer 196 and being introduced into the organic light-emitting layer 192 and the second electrode 193. The organic film may be formed of epoxy, acrylate, or urethane acrylate.

The display device 1 according to one example embodiment may include the driving transistor DRT with a plurality of oxide semiconductors, and the first switching transistor SCT with one oxide semiconductor. The driving transistor DRT may include the first active layer 350 and the first oxide layer 370, and the first switching transistor SCT may include the second active layer 450. In the driving transistor DRT, the first oxide layer 370 is disposed between the first active layer 350 and the first gate electrode 310 to secure a wide range of driving voltages. In contrast, in the first switching transistor SCT, the first oxide layer 370 is not disposed between the second active layer 450 and the second gate electrode 410, and thus high electron mobility may be secured in the channel region 450c.

Meanwhile, the scan driver SDR may also include a plurality of transistors, each of which may be formed to be substantially the same as the first switching transistor SCT of each pixel PX. Such second switching transistors GPT, which are included in the above-described scan driver SDR and the data voltage distribution circuit DMUX of the non-display area NDA, may each be formed to be substantially the same as the first switching transistor SCT shown in FIGS. 6 and 7.

For example, in each of a pull-up transistor TU and a pull-down transistor TD of the scan driver SDR, an oxide layer may not be disposed between the active layer and the gate electrode. In this case, a third active layer, a third gate electrode, a third source electrode, and a third drain electrode of each of the second switching transistors GPT of the scan driver SDR may be applied in substantially the same manner as the second active layer 450, the second gate electrode 410, the second source electrode 430, and the second drain electrode 440 of the first switching transistor SCT, which are described with reference to FIGS. 6 and 7, respectively.

Further, an oxide layer may not be disposed between the active layer and the gate electrode in each of first distribution transistors MT1 and second distribution transistors MT2 of the data voltage distribution circuit DMUX. In this case, a fourth active layer, a fourth gate electrode, a fourth source electrode, and a fourth drain electrode of each of the first distribution transistors MT1 and the second distribution transistors MT2 of the data voltage distribution circuit DMUX may be applied in substantially the same manner as the second active layer 450, the second gate electrode 410, the second source electrode 430, and the second drain electrode 440 of the first switching transistor SCT, which are described with reference to FIGS. 6 and 7, respectively.

Hereinafter, a method of manufacturing the display device 1 that includes the above-described driving transistor DRT and first switching transistor SCT will be described.

Figure 10:
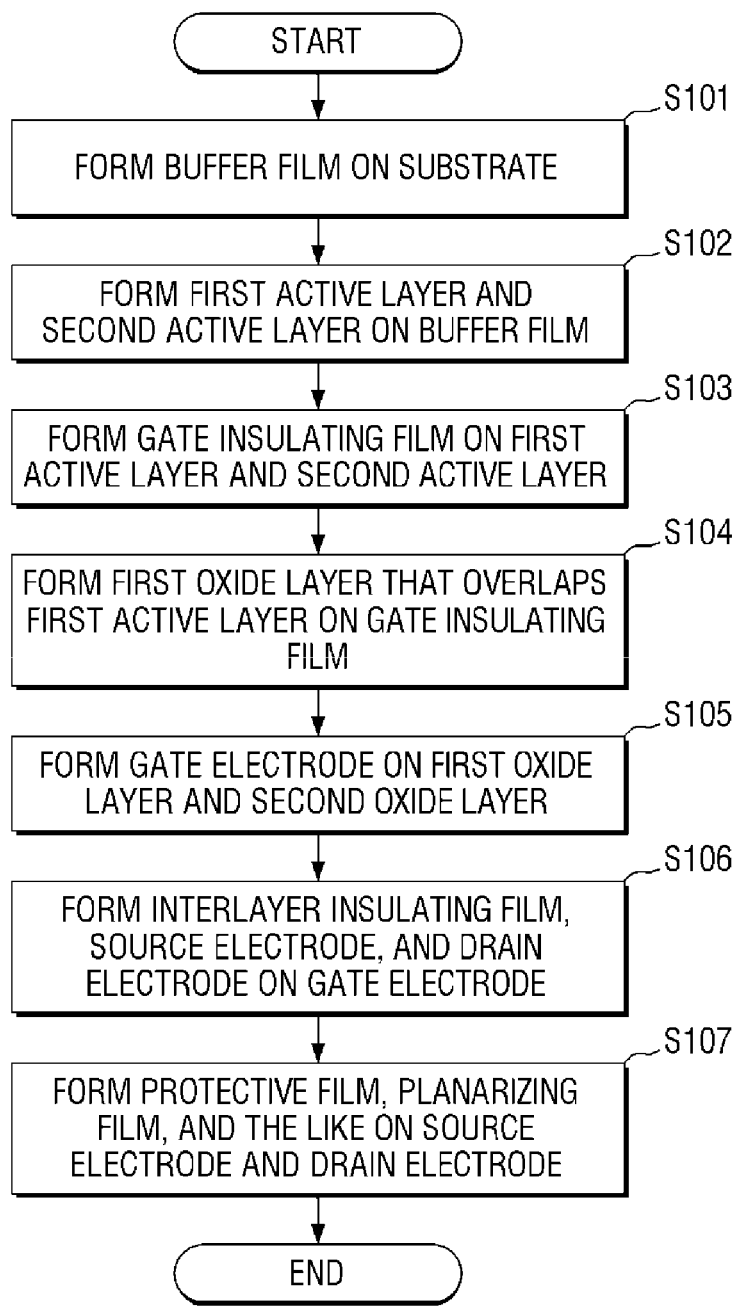
FIG. 10 is a flowchart illustrating a manufacturing process of a display device, according to one example embodiment.

FIG. 10 is a flowchart illustrating a manufacturing process of a display device according to one example embodiment.

Referring to FIG. 10, the manufacturing process of the display device 1 according to one example embodiment may include an act or subprocess of forming a first oxide layer 370 on a gate insulating layer that overlaps a first active layer 350 (S104). The first oxide layer 370 may include an oxide semiconductor that is different from those of the first active layer 350 and a second active layer 450, and may be disposed only on the first active layer 350. Accordingly, oxygen may be selectively supplied only to the first active layer 350, and the first active layer 350 and the second active layer 450 may have different compositions. Hereinafter, the manufacturing process of the display device 1 will be described in more detail with reference to other drawings.

FIGS. 11 to 22 are cross-sectional views illustrating the manufacturing process of the display device according to one example embodiment.

Figure 11:
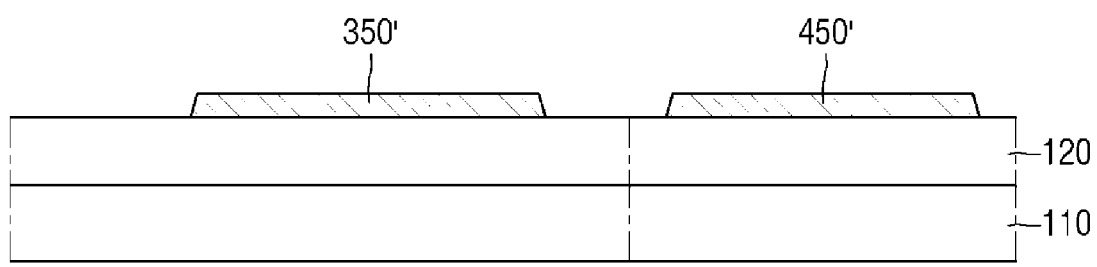
FIGS. 11 to 22 are cross-sectional views illustrating the manufacturing process of the display device according to one example embodiment.

First, referring to FIG. 11, a buffer layer 120 is formed on a first substrate 110. For example, an embodiment of the manufacturing process includes the act or sub-process of forming a buffer film on a substrate (S101). The buffer layer 120 may be formed on an entire surface of the first substrate 110. The buffer layer 120 may be formed by a chemical vapor deposition method, but the present disclosure is not limited thereto. In the present example embodiment, a process of forming a plurality of conductive layers and a plurality of semiconductor layers, including the members below, is not particularly limited as long as it can be generally employed. Hereinafter, the formation order and structure of each member will be described in more detail.

Figure 12:
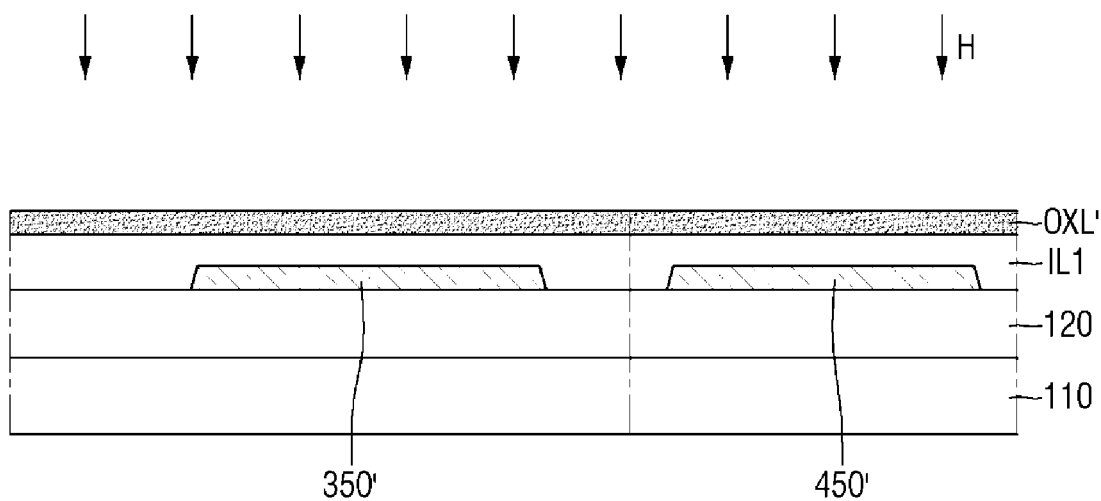

Next, referring to FIG. 12, a first semiconductor layer is formed on the buffer layer 120. For example, an embodiment of the manufacturing process includes the act or sub-process of forming a first active layer and second active layer on the buffer film (S102). The first semiconductor layer includes a first active layer 350' and a second active layer 450'. The first active layer 350' and the second active layer 450' may be formed by a patterning process using a photoresist after forming one layer by a sputtering method. However, the present disclosure is not limited thereto, and in some cases, the first active layer 350' and the second active layer 450' may be formed by an atomic layer deposition method. It is illustrated in FIG. 12 that a conductive region and a channel region are not formed in the first active layer 350' and the second active layer 450'. Some regions of the first active layer 350' and the second active layer 450' may become conductive in a subsequent process to form the conductive region and the channel region.

Figure 13:
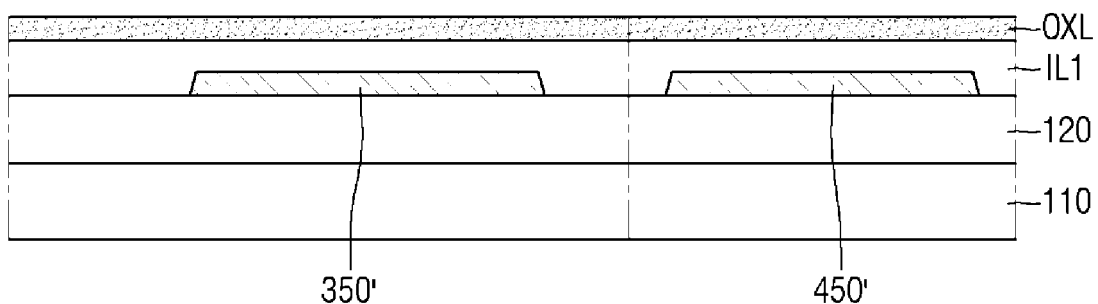

Next, referring to FIGS. 12 and 13, a first insulating layer IL1 is formed on the first semiconductor layer, and an oxide semiconductor layer OXL' is formed on the first insulating layer IL1. For example, an embodiment of the manufacturing process includes the act or sub-process of forming a gate insulating film on the first active layer and the second active layer (S103), and an act or subprocess of forming a first oxide layer that overlaps the first active layer on the gate insulating film (S104), as described above. The first insulating layer IL1 and the oxide semiconductor layer OXL' may be disposed on an entire surface of the buffer layer 120, and may be disposed to overlap each of the first active layer 350' and the second active layer 450' of the first semiconductor layer. The first insulating layer IL1 may be patterned in a subsequent process to form a first gate insulating layer 130, and the oxide semiconductor layer OXL' may form the first oxide layer 370.

Next, referring to FIGS. 12 and 13, the oxide semiconductor layer OXL' is heat-treated (H) to form an oxide layer OXL. The oxide semiconductor layer OXL' may inject oxygen into the first insulating layer IL1, which is formed therebelow, by a heat-treatment process.

Figure 14:
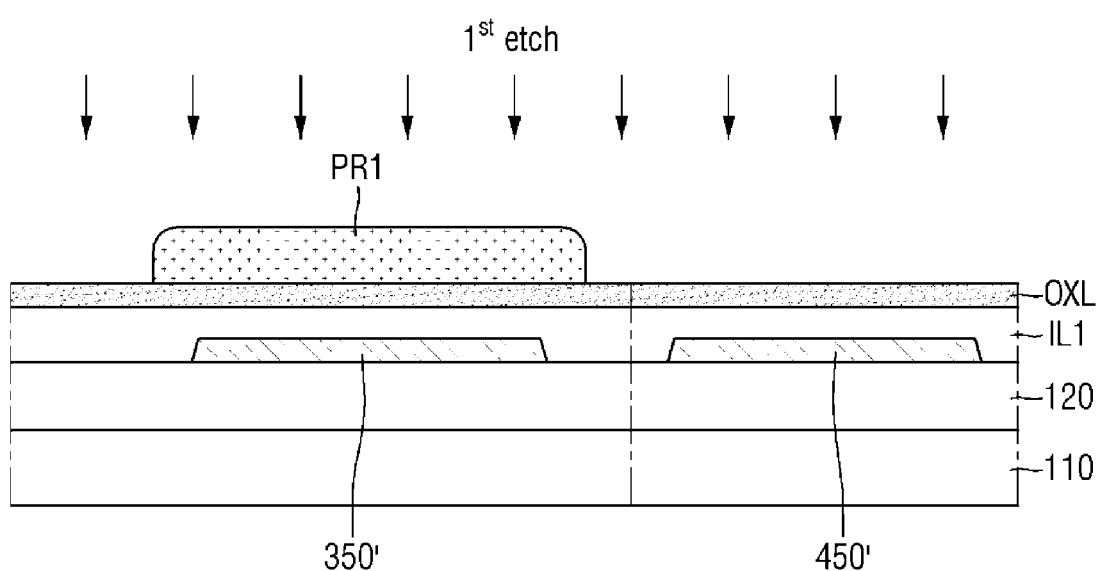
Figure 15:
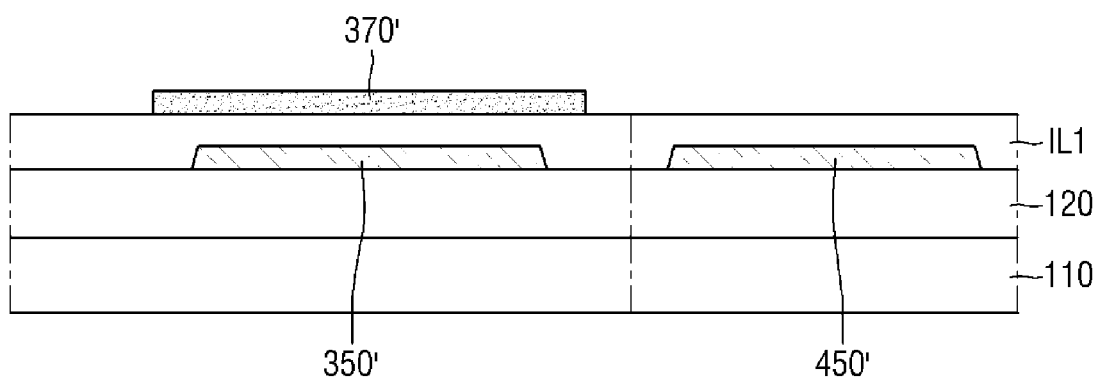

Referring to FIGS. 14 and 15, a first etching process ($1^{st}$ etch) of forming a first photoresist PR1 on at least some regions of the oxide layer OXL, which is formed by a heat-treatment process, and partially etching the oxide layer OXL is performed. The first photoresist PR1 may perform the function of a mask for removing some regions of the oxide layer OXL. The first photoresist PR1 may be disposed on the first active layer 350', and may not be disposed on the second active layer 450'. Accordingly, the oxide layer OXL, which is disposed above the second active layer 450', may be removed by the first etching process ($1^{st}$ etch), and may remain only above the first active layer 350' (reference numeral 370' in FIG. 15).

Figure 16:
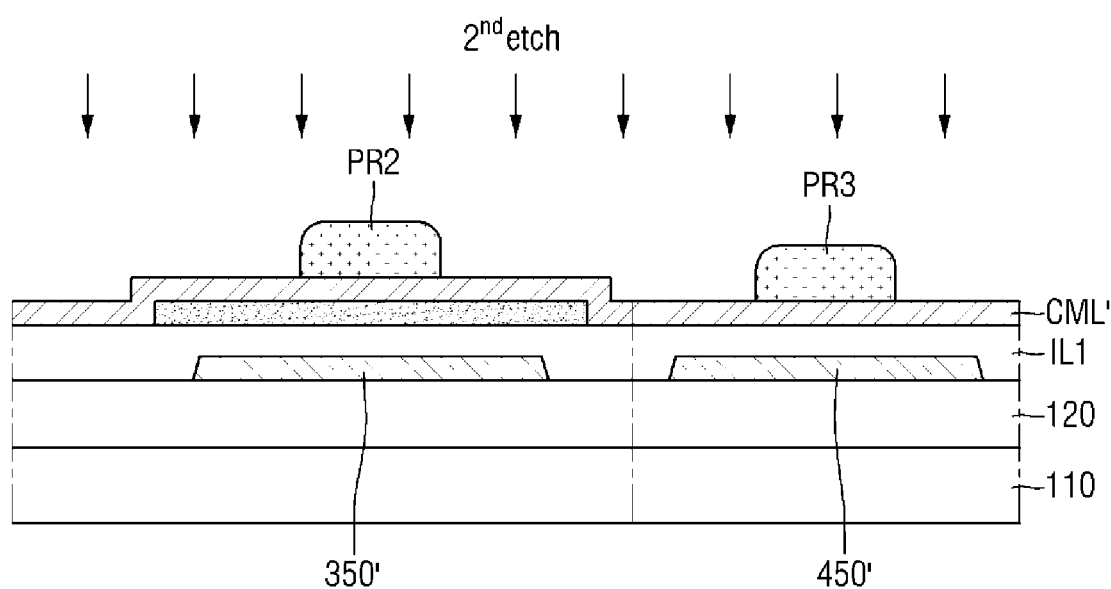
Figure 17:
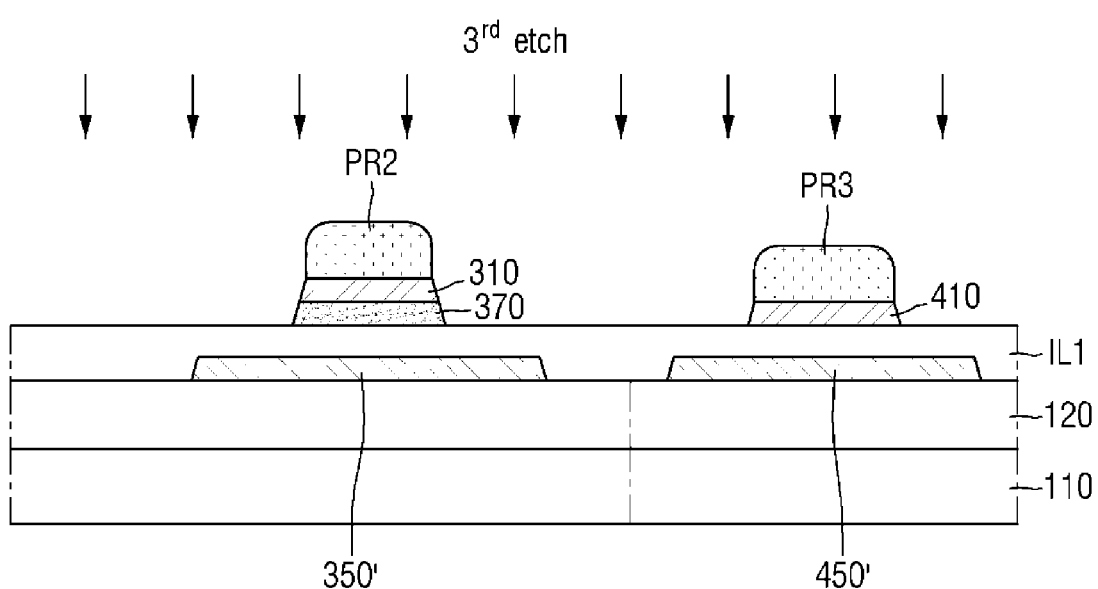

Next, referring to FIGS. 16 and 17, a conductive metal layer CML' is formed on an oxide layer 370' and the first insulating layer IL1, and the oxide layer 370' and the conductive metal layer CML' are partially etched to form the first oxide layer 370, a first gate electrode 310, and a second gate electrode 410. For example, an embodiment of the manufacturing process includes the act or sub-process of forming gate electrode(s) on the first oxide layer and the second oxide layer (S105). The conductive metal layer CML' is formed on an entire surface of the first insulating layer IL1 that includes the oxide layer 370', and the first conductive layer may be formed in a subsequent process. For example, the conductive metal layer CML' may be patterned in a subsequent process to form the first gate electrode 310 and the second gate electrode 410.

As illustrated in FIG. 16, a second etching process ($2^{nd}$ etch) of forming a second photoresist PR2 and a third photoresist PR3 on the conductive metal layer CML' and partially etching the conductive metal layer CML' and the oxide layer 370' is performed. The second photoresist PR2 and the third photoresist PR3 may perform the function of a mask for forming the first gate electrode 310 and the second gate electrode 410, respectively. The second photoresist PR2 may be disposed above the first active layer 350', and the third photoresist PR3 may be disposed above the second active layer 450'. The conductive metal layer CML' and the oxide layer OXL may be etched and removed in portions other than the second photoresist PR2 and the third photoresist PR3, and as illustrated in FIG. 17, the first conductive layer, which includes the first gate electrode 310 and the second gate electrode 410, and the first oxide layer 370 may be formed. Alternatively, in some example embodiments, the conductive metal layer CML' and the oxide layer OXL may have an etch selectivity different from that of the first insulating layer IL1. The first insulating layer IL1 may be patterned in a subsequent process to form the first gate insulating layer 130.

In some embodiments, a width of the second photoresist PR2 may be substantially equal to a width of the first gate electrode 310, and a width of the third photoresist PR3 may be substantially equal to a width of the second gate electrode 410. In some embodiments, a width of the first photoresist PR1 may be greater or smaller than the width of the second photoresist PR2. When the width of the first photoresist PR1 is greater than the width of the second photoresist PR2, a width of the first oxide layer 370 that is formed along the second photoresist PR2 may be substantially equal to that of the first gate electrode 310, as shown in the drawing. The first gate electrode 310 is disposed only on an upper surface of the first oxide layer 370, and both side surfaces of the first oxide layer 370 are (e.g., simultaneously) exposed and may be in contact with a first interlayer insulating layer 160 that is formed later. A width of a channel region 350c of the first active layer 350, which is formed in a subsequent process, may be substantially equal to the width of the first gate electrode 310 and may also be substantially equal to the width of the first oxide layer 370.

On the other hand, when the width of the first photoresist PR1 is smaller than the width of the second photoresist PR2, the width of the first oxide layer 370 is substantially equal to the width of the first photoresist PR1, and the width of the first gate electrode 310 formed along the second photoresist PR2 may be greater than the width of the first oxide layer 370. In this case, the width of the first oxide layer 370 may be smaller than the width of the channel region 350c of the first active layer 350. In some embodiments, the first gate electrode 310 may be disposed on the upper surface and both side surfaces of the first oxide layer 370, and the first oxide layer 370 may not be in contact with the first interlayer insulating layer 160. This will be described below with reference to other example embodiments.

Figure 18:
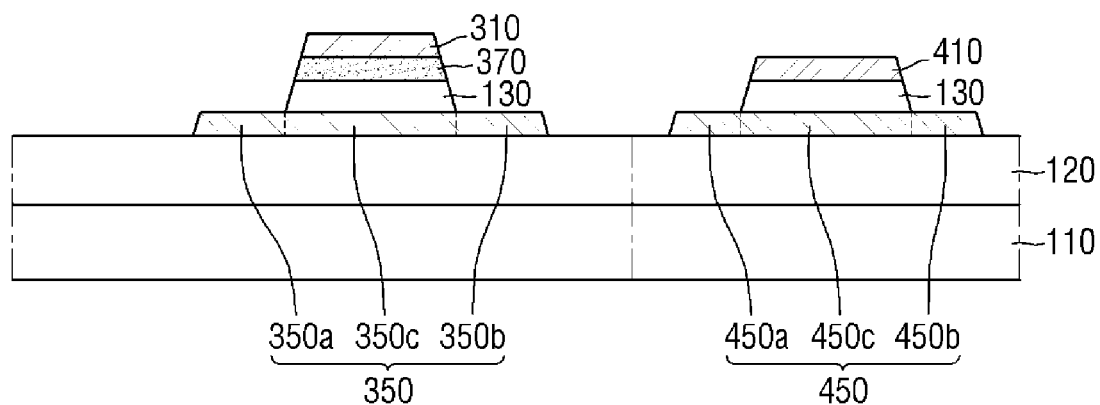

Next, referring to FIGS. 17 and 18, a third etching process ($3^{rd}$ etch) of etching the first insulating layer IL1 along the second photoresist PR2 and the third photoresist PR3 is performed to form the first gate insulating layer 130. The first gate insulating layer 130 may be disposed between the first active layer 350 and the first oxide layer 370 and between the second active layer 450 and the second gate electrode 410.

Subsequently, the second photoresist PR2 and the third photoresist PR3 are removed, and some (set or predetermined) regions of each of the first active layer 350 and the second active layer 450 are conductive to form first conductive regions 350a and 450a, second conductive regions 350b and 450b, and channel regions 350c and 450c.

Figure 19:
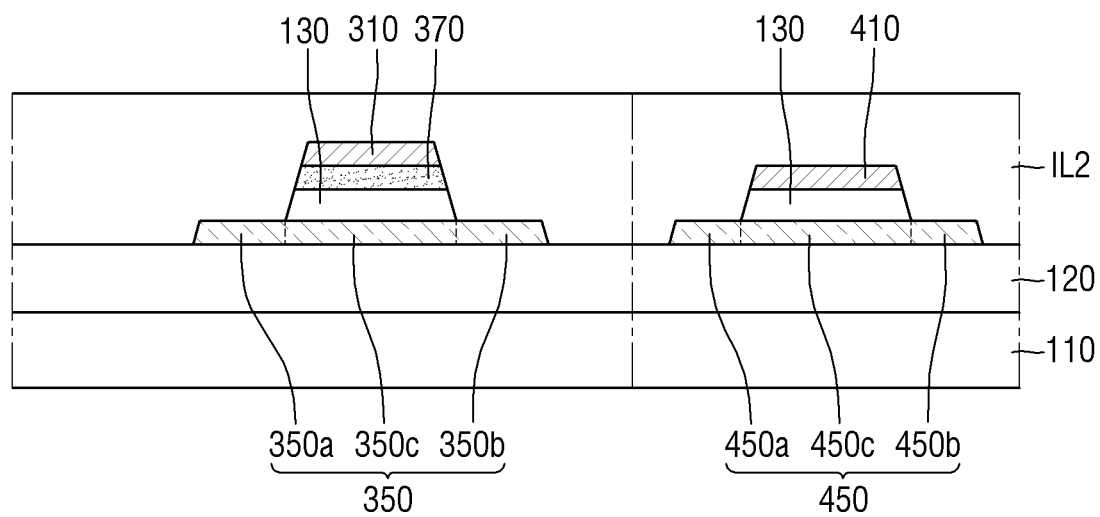

Next, referring to FIG. 19, a second insulating layer IL2 is formed on the first conductive layer. The second insulating layer IL2 may be partially etched in a subsequent process (FIG. 20) to form the first interlayer insulating layer 160.

Figure 20:
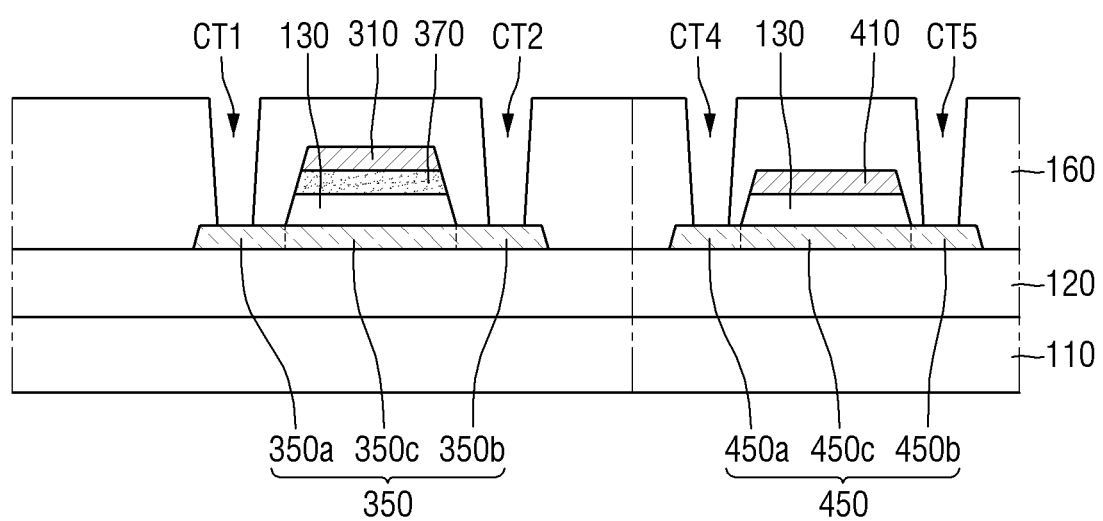

Next, referring to FIG. 20, a plurality of contact holes CT1, CT2, CT4, and CT5 are formed in the second insulating layer IL2 to provide the first interlayer insulating layer 160. A first contact hole CT1, a second contact hole CT2, a fourth contact hole CT4, and a fifth contact hole CT5 may be formed in the first interlayer insulating layer 160.

Figure 21:
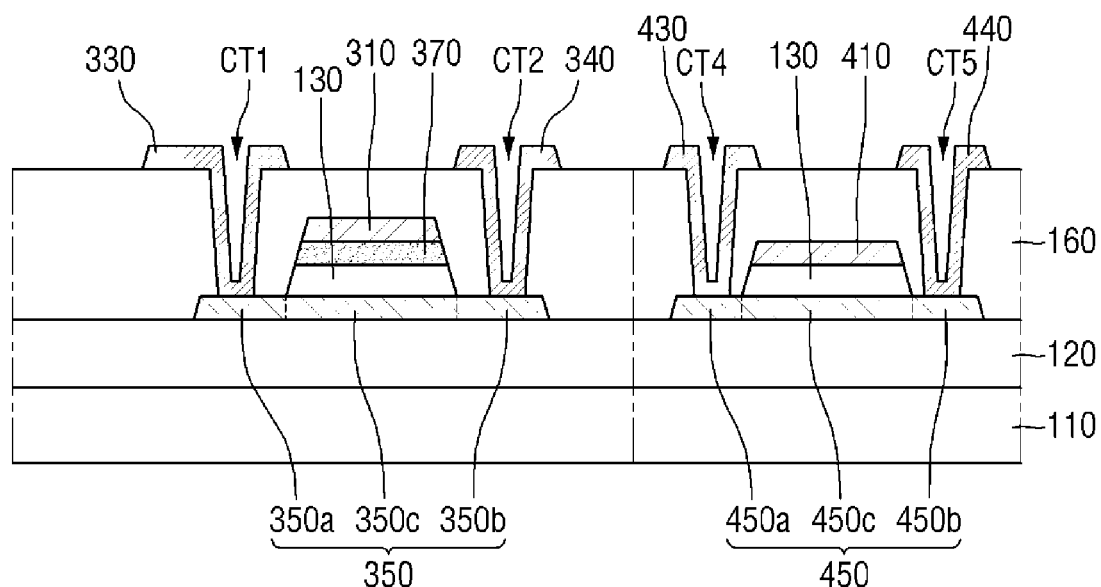

Next, referring to FIG. 21, a second conductive layer is formed on the first interlayer insulating layer 160. The second conductive layer may include a first source electrode 330, a first drain electrode 340, a second source electrode 430, and a second drain electrode 440. Each of the source electrodes 330 and 430 and each of the drain electrodes 340 and 440 may be in contact with some regions of the first active layer 350 or the second active layer 450 through the contact holes CT1, CT2, CT4, and CT5, respectively. Descriptions thereof have been provided above. For example, as shown in FIGS. 17 to 21, an embodiment of the manufacturing process includes the act or sub-process of forming the interlayer insulating film, source electrode, and drain electrode on the gate electrode (S106).

Figure 22:
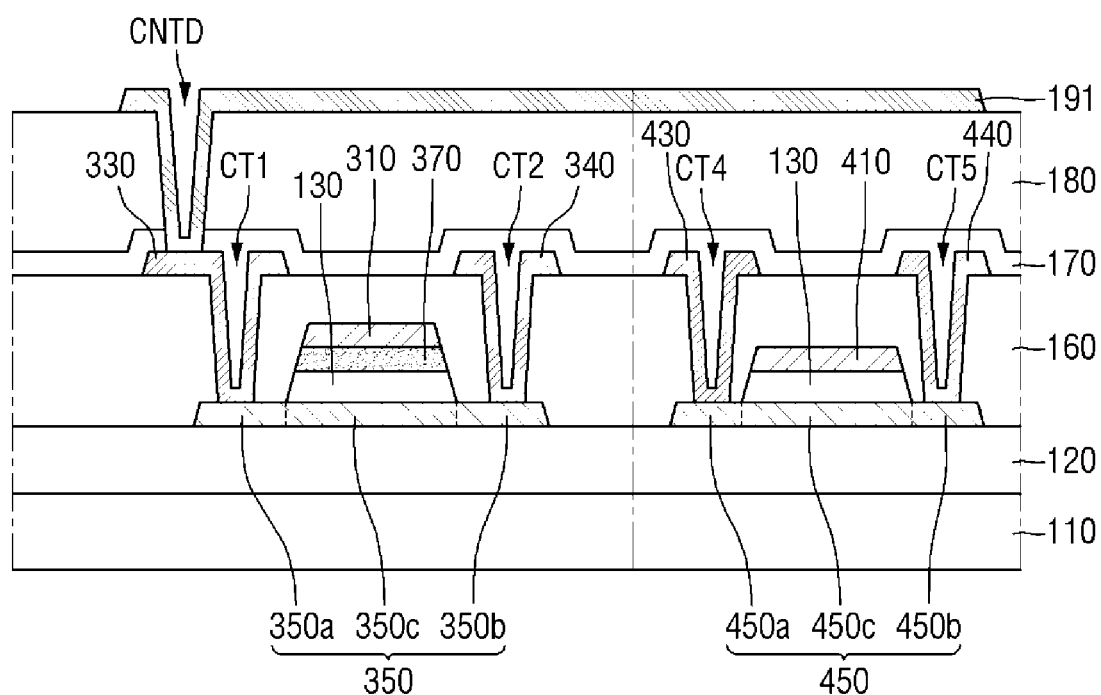

Next, referring to FIG. 22, a first protective film 170, which is disposed on the second conductive layer, and a first planarizing film 180, which is disposed on the first protective film 170, are formed, and then an electrode contact hole CNTD that exposes the first source electrode 330 and a first electrode 191 are formed on the first planarizing film 180. For example, an embodiment of the manufacturing process includes the act or sub-process of forming the protective film, planarizing film, and the like on the drain electrode and source electrode (S107).

Lastly, an organic light-emitting layer 192, a pixel definition film 195, a second electrode 193, and an encapsulation layer 196 are formed on the first electrode 191 to manufacture the display device 1, as shown in FIG. 7.

The display device 1 according to one example embodiment may be manufactured through the above-described processes. In the display device 1, the first switching transistor SCT may not include the first oxide layer 370 by including a process of forming the first oxide layer 370 only on the first active layer 350 of the driving transistor DRT. The process of forming the first oxide layer 370 may include a process of forming the oxide semiconductor layer OXL' and heat-treating the oxide semiconductor layer OXL' to form the oxide layer OXL. In the heat-treatment process, oxygen (O) may be supplied to the first insulating layer IL1 disposed below the oxide layer OXL, e.g., to the first gate insulating layer 130, and may be injected into the first active layer 350 of the driving transistor DRT.

In some embodiments, in the process of forming the oxide layer OXL, the process of partially etching the oxide layer OXL may not necessarily be performed after the heat-treatment process.

Figure 23:
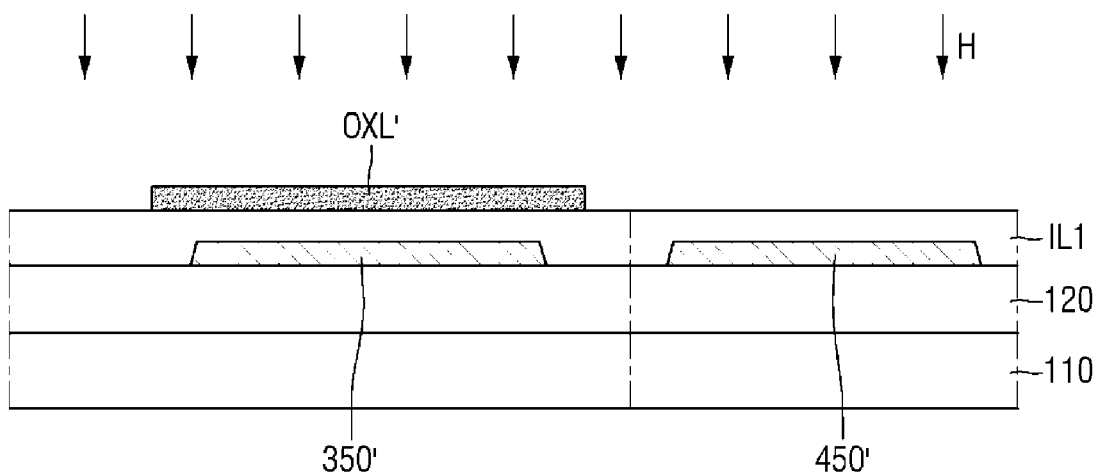
FIG. 23 is a cross-sectional view illustrating a part of a manufacturing process of a display device according to another example embodiment.

FIG. 23 is a cross-sectional view illustrating a part of a manufacturing process of a display device according to another example embodiment.

Referring to FIG. 23, forming an oxide layer OXL may include removing an oxide semiconductor layer OXL', which is disposed on a second active layer 450', by partially etching an oxide semiconductor layer OXL' and heat-treating the partially removed oxide semiconductor layer OXL' to form the oxide layer OXL. For example, the oxide layer OXL may be formed by partially etching the oxide semiconductor layer OXL' that is disposed on an entire surface of a first insulating layer IL1 and then performing a heat-treatment process. In this case, oxygen supplied from the oxide layer OXL may be supplied only to the first insulating layer IL1, which is disposed on the first active layer 350', in the heat-treatment process. As a result, the content of oxygen injected into the second active layer 450' may be minimized or reduced, and the first switching transistor SCT that includes the second active layer 450' may have high mobility without discharge of hydrogen.

Further, in some cases, when the oxide semiconductor layer OXL' is formed only above the first active layer 350', the heat-treatment process may be performed in a state in which the oxide semiconductor layer OXL' is not disposed on the second active layer 450. As illustrated in FIG. 23, even when the heat-treatment process is performed on an entire surface of the first insulating layer IL1, because the oxide semiconductor layer OXL' is disposed to overlap only the first active layer 350', the oxide layer OXL may be formed only on the first active layer 350'. Subsequent processes are the same as those described above with reference to FIGS. 16 to 22.

Hereinafter, various structures of the driving transistor DRT and the first switching transistor SCT will be described with reference to other drawings.

Figure 24:
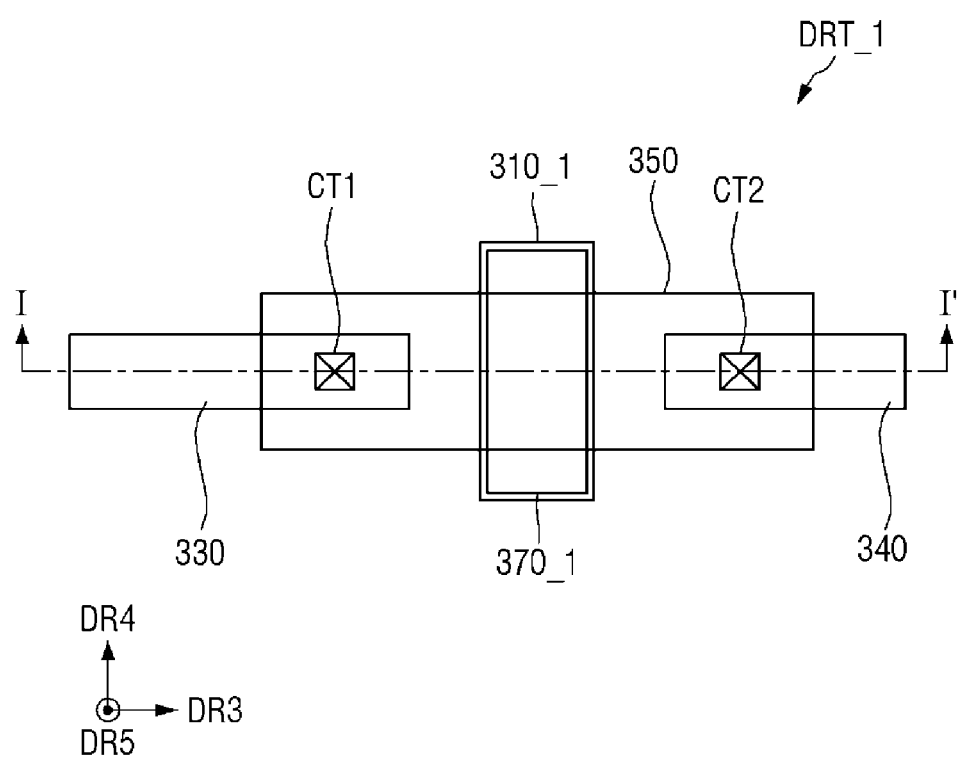
FIG. 24 is a plan view illustrating a driving transistor according to another example embodiment.
Figure 25:
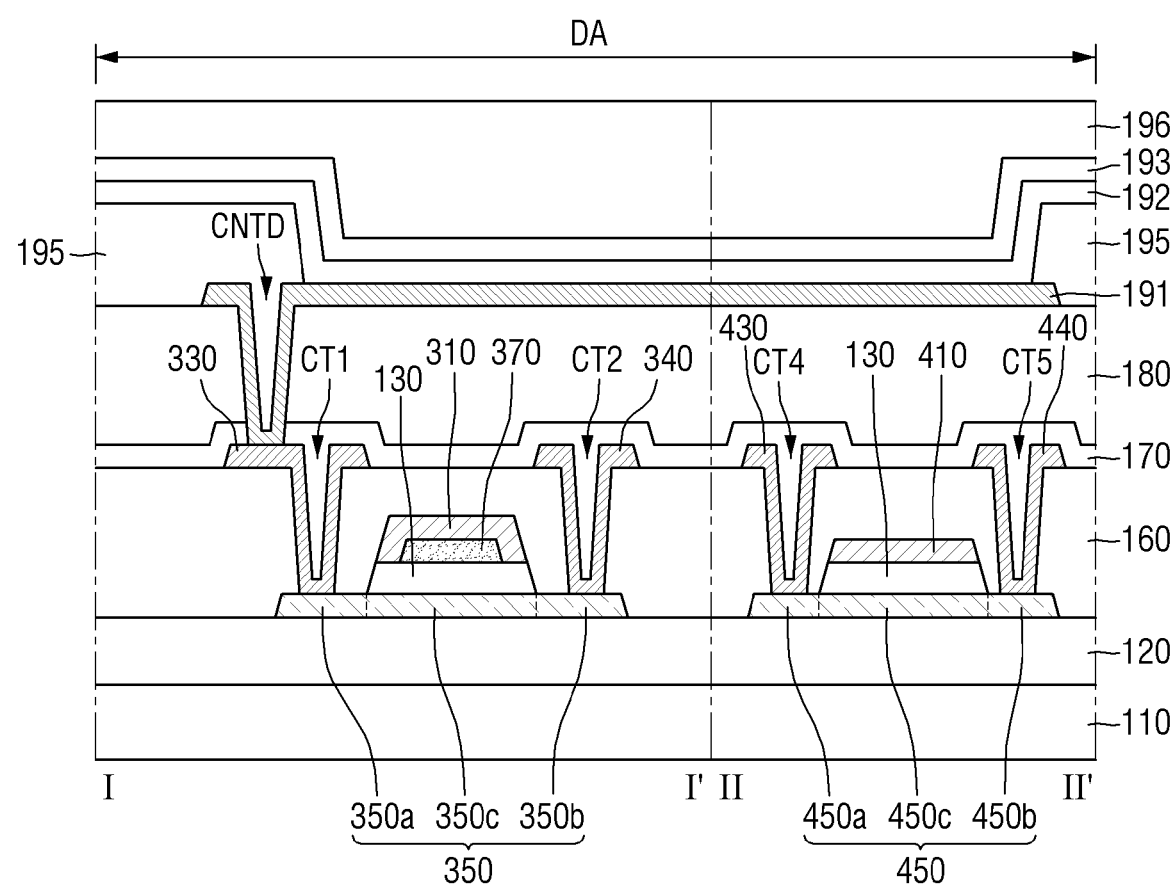
FIG. 25 is a cross-sectional view taken along line I-I' of FIG. 24 and line II-II' of FIG. 6.

FIG. 24 is a plan view illustrating a driving transistor DRT_1 according to another example embodiment. FIG. 25 is a cross-sectional view taken along line I-I' of FIG. 24 and line II-II' of FIG. 6.

Referring to FIGS. 24 and 25, in a driving transistor DRT_1 according to an example embodiment, a width of a first oxide layer 370_1 (370) may be smaller than a width of a first gate electrode 310_1 (310). Both side surfaces of the first oxide layer 370_1 (370) may (e.g., simultaneously) be in contact with the first gate electrode 310_1 (310) without being exposed. The driving transistor DRT_1 of the present example embodiment differs from the driving transistor DRT of FIGS. 5 and 6 in that the first oxide layer 370_1 (370) has a smaller width. In the following, redundant descriptions will be omitted, and descriptions will be provided to focus on differences from the above-described contents.

In the driving transistor DRT_1 of FIGS. 24 and 25, the width of the first oxide layer 370_1 (370) may be smaller than the width of the first gate electrode 310_1 (310). An upper surface and both side surfaces of the first oxide layer 370_1 (370) may (e.g., simultaneously) be in contact with the first gate electrode 310_1 (310), and the first gate electrode 310_1 (310) may be disposed to cover an outer surface of the first oxide layer 370_1 (370). Accordingly, a portion of a lower surface of the first gate electrode 310_1 (310) may also be in contact with a first gate insulating layer 130, as in a second gate electrode 410.

Further, according to an example embodiment, the width of the first oxide layer 370_1 (370) may be smaller than a width of a channel region 350c of a first active layer 350_1 (350). The channel region 350c of the first active layer 350_1 (350) may be formed to have substantially the same width as the first gate electrode 310_1 (310). When the first oxide layer 370_1 (370) has a smaller width than the first gate electrode 310_1 (310), the width of the first oxide layer 370_1 (370) may be smaller than the width of the channel region 350c of the first active layer 350_1 (350).

Such a shape of the first oxide layer 370_1 (370) may be formed as the first photoresist PR1 has a smaller width than the second photoresist PR2 during the manufacturing process of the display device 1. As described above, the width of the first gate electrode 310_1 (310) may be substantially equal to that of the second photoresist PR2, and the width of the first oxide layer 370_1 (370) may vary depending on the width of the first photoresist PR1. Referring again to FIGS. 14 to 18, the width of the oxide layer OXL that remains on the first insulating layer IL1 due to the first photoresist PR1 is greater than a width of the second photoresist PR2.

Here, when the width of the first photoresist PR1 is smaller than that of the second photoresist PR2, the width of the oxide layer OXL (analogous to OXL') that remains on the first insulating layer IL1 may be smaller than the width of the second photoresist PR2. In the subsequent process, the conductive metal layer CML' that is disposed on the oxide layer OXL may also be in contact (e.g., simultaneously) with both side surfaces of the oxide layer OXL, and when the conductive metal layer CML' is etched along the second photoresist PR2, the portions in contact with both side surfaces of the oxide layer OXL remain. Because the width of the second photoresist PR2 is greater than the width of the oxide layer OXL, a region in which the second photoresist PR2 is disposed may include a region in which the oxide layer OXL is not disposed. Accordingly, the first gate electrode 310_1 (310) that is formed after performing the second etching process (2$^{nd}$ etch) along the second photoresist PR2 may have a greater width than the first oxide layer 370_1 (370).

The first gate electrode 310 and the first oxide layer 370 may have different etch selectivity so that the first oxide layer 370 may be more etched (e.g., to a larger degree) when the first gate electrode 310 and the first oxide layer 370 are etched in the same process. Accordingly, side surfaces of the first oxide layer 370 may be further recessed than side surfaces of the first gate electrode 310. When the side surfaces of the first oxide layer 370 are recessed, an insulating material of the first interlayer insulating layer 160 that is formed in the subsequent process may not be deposited on the side surfaces of the first oxide layer 370 so that cracks may be generated. This may be a factor that hinders device characteristics and reliability of the driving transistor DRT.

According to an example embodiment, the first gate electrode 310_1 (310) may be formed to have a greater width than the first oxide layer 370_1 (370). Accordingly, cracks may be prevented or reduced from being formed in the first interlayer insulating layer 160, and further, device characteristics and reliability may be improved by securing structural stability of the driving transistor DRT_1. Because the first gate electrode 310_1 (310) has a greater width and is disposed on the first oxide layer 370_1 (370), the first gate electrode 310_1 (310) may be disposed to cover the upper surface and the side surfaces of the first oxide layer 370_1 (370). Unlike the example embodiment of FIG. 7, the first oxide layer 370_1 (370) may not be in contact with the first interlayer insulating layer 160.

Furthermore, the channel region 350c of the first active layer 350_1 (350), which is formed in a subsequent process, may have the same width as the first gate electrode 310_1 (310), and at the same time, have a width greater than that of the first oxide layer 370_1 (370). However, because the first oxide layer 370_1 (370) may be formed to overlap at least the channel region 350c of the first active layer 350_1 (350), oxygen (O) may be injected into the first active layer 350_1 (350) from the first oxide layer 370_1 (370), thereby securing a wide range of driving voltages.

Meanwhile, the display device 1 may further include a third conductive layer that is disposed between the first substrate 110 and the buffer layer 120.

Figure 26:
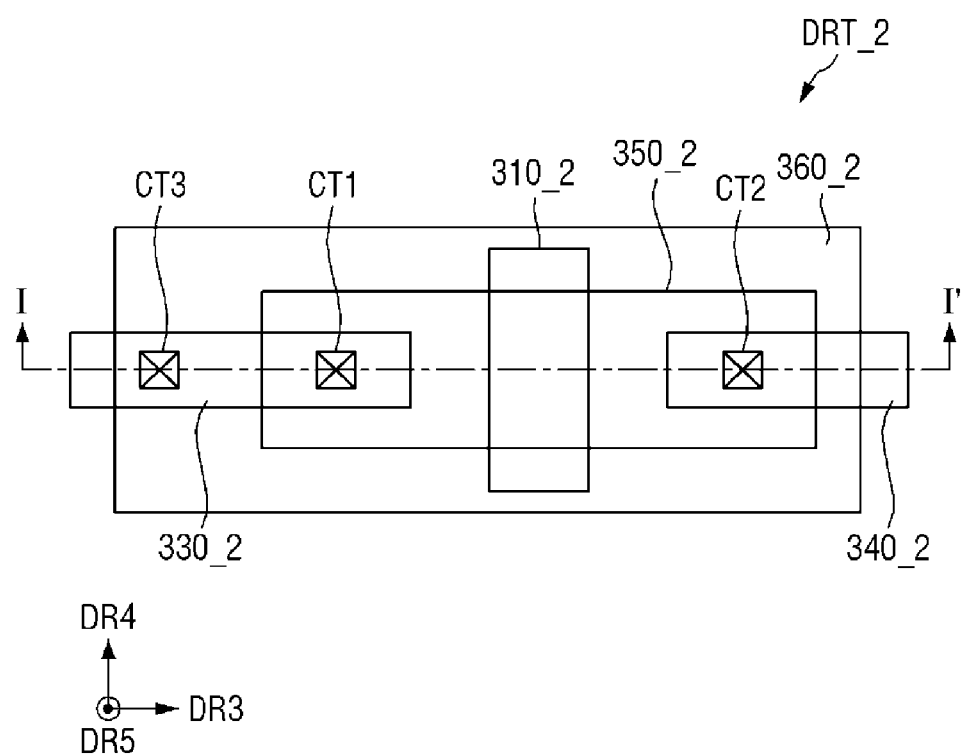
FIG. 26 is a plan view illustrating a driving transistor according to still another example embodiment.
Figure 27:
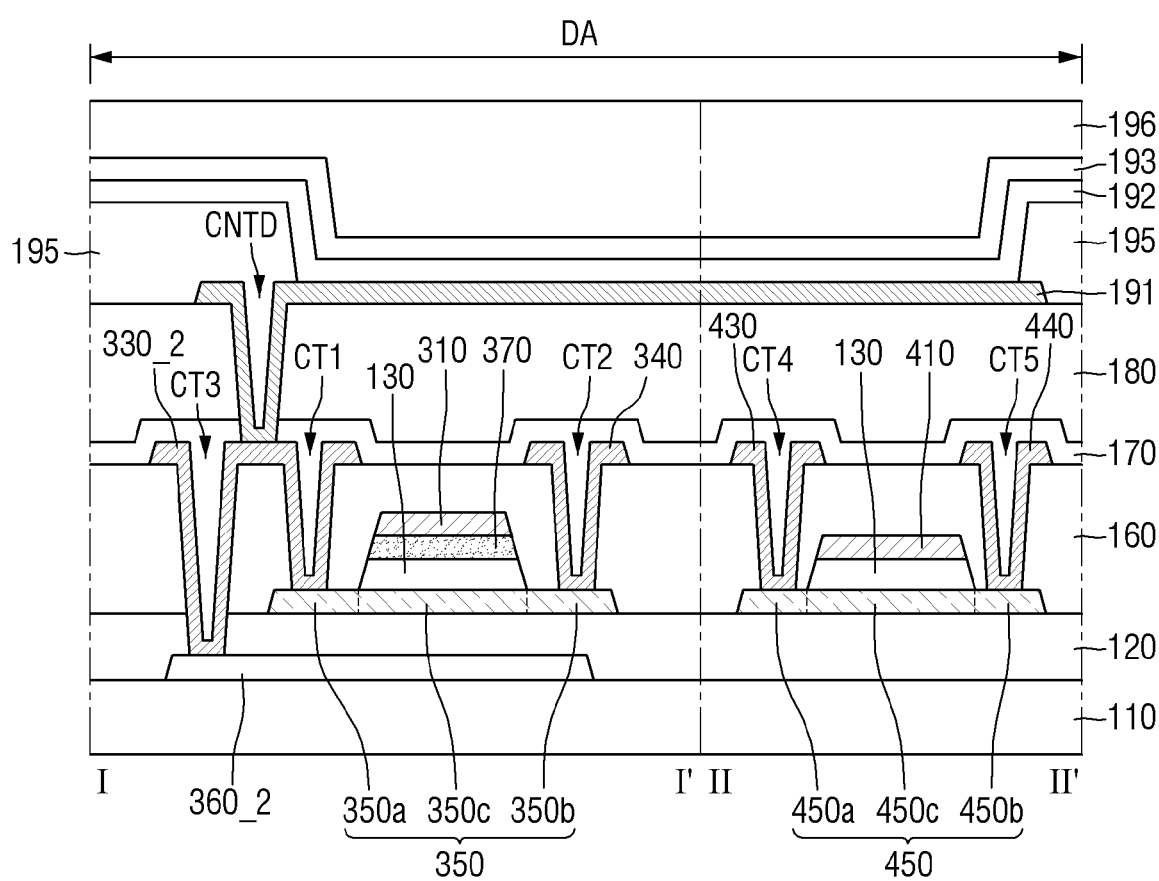
FIG. 27 is a cross-sectional view taken along line I-I' of FIG. 26 and line II-II' of FIG. 6.

FIG. 26 is a plan view illustrating a driving transistor according to still another example embodiment. FIG. 27 is a cross-sectional view taken along line I-I' of FIG. 26 and line II-II' of FIG. 6.

Referring to FIGS. 26 and 27, a display device 1 according to an example embodiment may further include a third conductive layer that is disposed between a first substrate 110 and a buffer layer 120. The third conductive layer may include a first light-blocking layer 360_2 that is disposed to overlap a first active layer 350_2 of a driving transistor DRT_2. The driving transistor DRT_2 includes a first gate electrode 310_2, a first source electrode 330_2, a first drain electrode 340_2, and the first light-blocking layer 360_2, where the first source electrode 330_2 may be connected to the first light-blocking layer 360_2. The driving transistor DRT_2 of FIGS. 26 and 27 is different from the driving transistor DRT of FIGS. 5 and 7 in that the driving transistor DRT_2 further includes the first light-blocking layer 360_2. In the following, redundant descriptions will be omitted, and descriptions will be provided to focus on differences from the above-described contents.

The third conductive layer may be disposed between the first substrate 110 and the buffer layer 120. The third conductive layer includes the first light-blocking layer 360_2 of the driving transistor DRT_2.

The first light-blocking layer 360_2 may be disposed on the first substrate 110 to overlap the first active layer 350_2 (350) of the driving transistor DRT_2. The first light-blocking layer 360_2 may block light from being incident on the first active layer 350_2 (350) from the first substrate 110. The first light-blocking layer 360_2 may prevent or reduce leakage current that flows in the first active layer 350_2 (350) when light from the first substrate 110 is incident on the first active layer 350_2 (350). A width of the first light-blocking layer 360_2, which is measured in one direction (e.g., along DR3), may be greater than a width of the first active layer 350_2 (350), which is measured in the one direction. However, the present disclosure is not limited thereto, and the width of the first light-blocking layer 360_2 may be smaller than the width of the first active layer 350_2 (350) but at least greater than a width of a channel region 350c_2 (350c) of the first active layer 350_2 (350). The first light-blocking layer 360_2 may be formed of a single layer or multi-layer made of one selected from molybdenum (Mo), aluminum (Al), chromium (Cr), gold (Au), titanium (Ti), nickel (Ni), neodymium (Nd), copper (Cu), and an alloy thereof.

A third contact hole CT3, which expose the first light-blocking layer 360_2 through a first interlayer insulating layer 160_2 (160) and the buffer layer 120, may be formed in the first interlayer insulating layer 160_2 (160) and the buffer layer 120. The first source electrode 330_2 of the driving transistor DRT_2 may be in contact with the first light-blocking layer 360_2 that is exposed by the third contact hole CT3. As a result, the driving transistor DRT_2 may secure a wider range of driving voltages.

Figure 28:
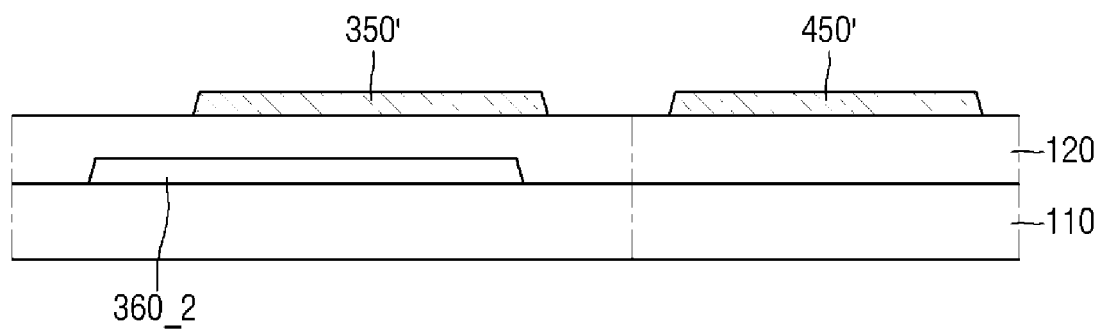
FIGS. 28 and 29 are cross-sectional views illustrating a part of a manufacturing process of a display device including the driving transistor of FIG. 26.
Figure 29:
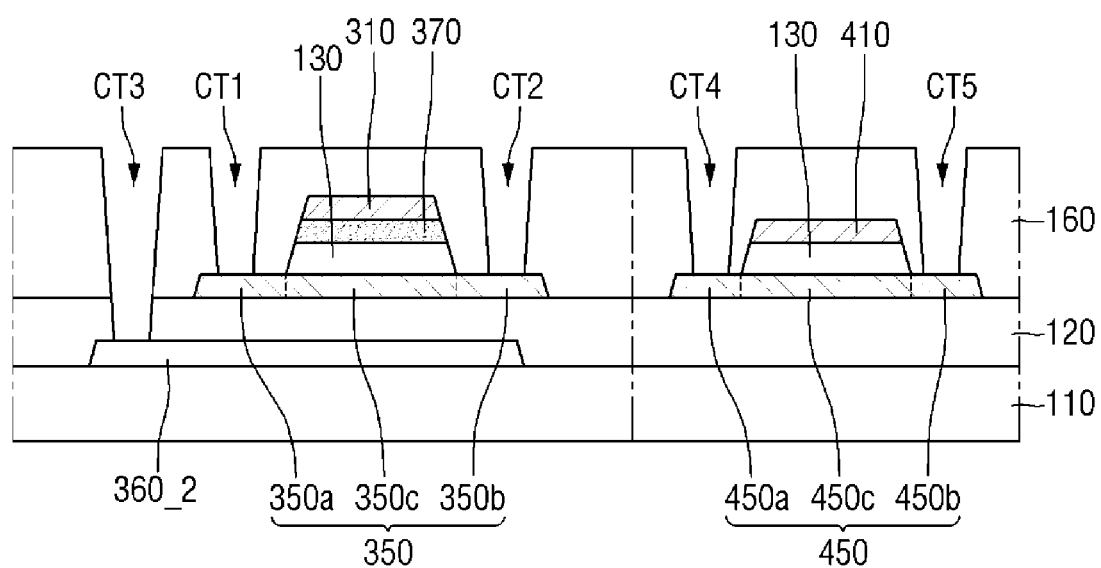

FIGS. 28 and 29 are cross-sectional views illustrating a part of a manufacturing process of a display device including the driving transistor of FIG. 26.

Referring to FIG. 28, before forming the buffer layer 120 on the first substrate 110, a first conductive layer is formed on the first substrate 110. The first conductive layer includes a first light-blocking layer 360_2. In the example embodiment, the first light-blocking layer 360_2 may be formed by patterning a metal layer, which is formed on the first substrate 110 by a sputtering method, by an etching process using a photoresist pattern. However, the present disclosure is not limited thereto.

The buffer layer 120, which is formed in a subsequent process, may be disposed on the first substrate 110 to cover the first light-blocking layer 360_2.

Next, referring to FIG. 29, in the process of forming the first interlayer insulating layer 160_2 (160), a third contact hole CT3, which contacts a portion of the first light-blocking layer 360_2 through a second insulating layer IL2 and the buffer layer 120, may be formed in the second insulating layer IL2 and the buffer layer 120. The first interlayer insulating layer 160_2 (160) may further include the third contact hole CT3, and the first source electrode 330_2 of the second conductive layer may be in contact with the first light-blocking layer 360_2 through the third contact hole CT3.

In some embodiments, the third conductive layer may further include a second light-blocking layer that overlaps the second active layer 450 of the first switching transistor SCT.

Figure 30:
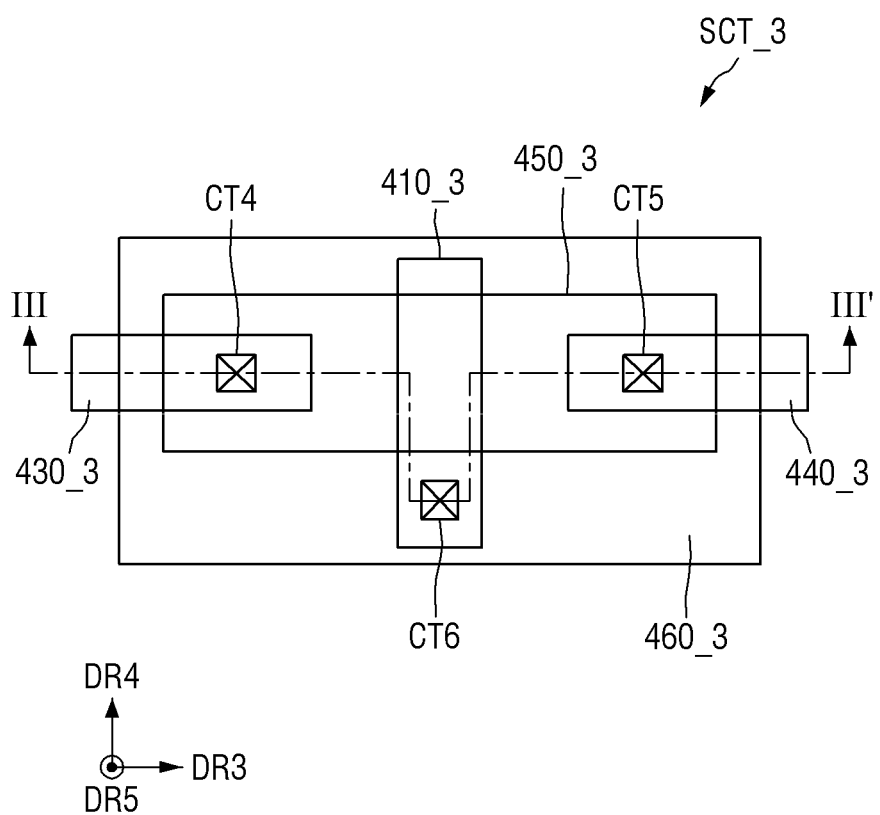
FIG. 30 is a plan view illustrating a first switching transistor according to another example embodiment.
Figure 31:
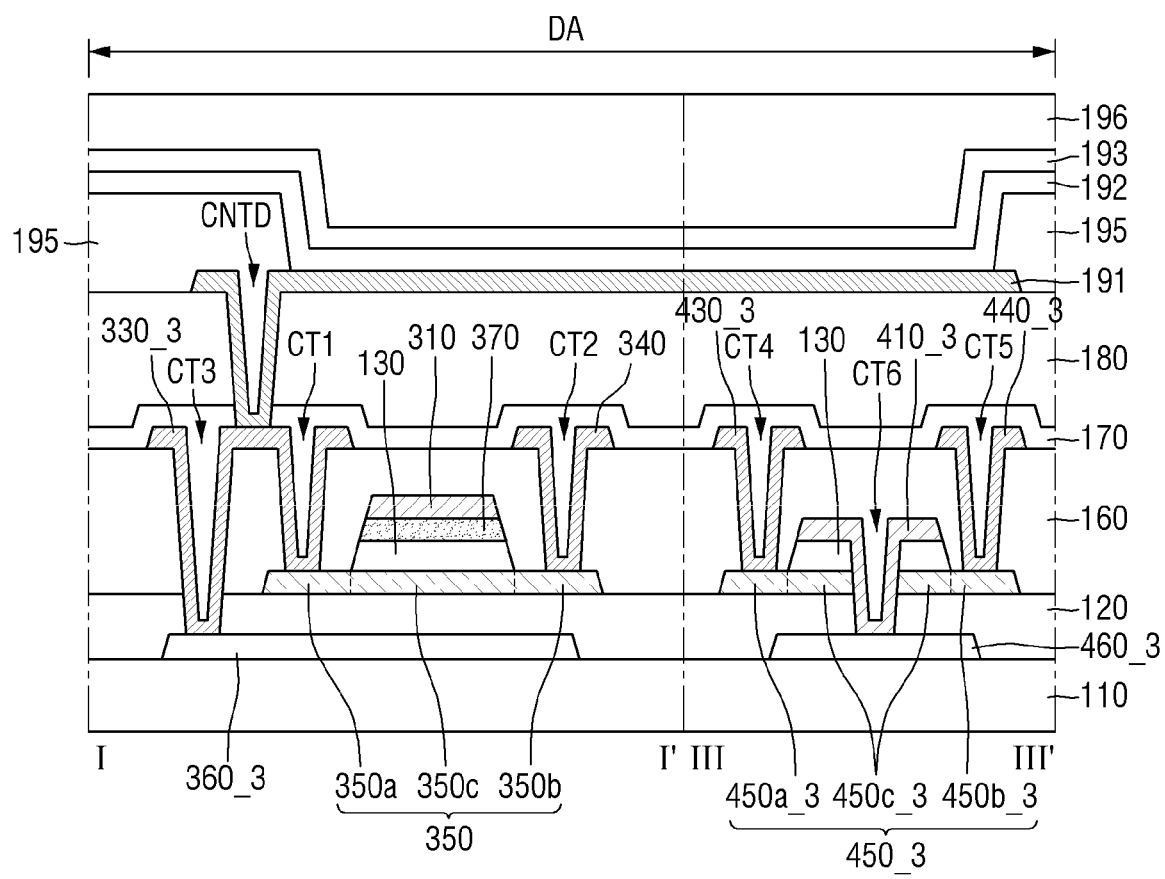
FIG. 31 is a cross-sectional view taken along line I-I' of FIG. 26 and line III-III' of FIG. 30.

FIG. 30 is a plan view illustrating a first switching transistor SCT_3 according to another example embodiment. FIG. 31 is a cross-sectional view taken along line I-I' of FIG. 26 and line of FIG. 30.

Referring to FIGS. 30 and 31, the first switching transistor SCT_3 according to an example embodiment further includes a second light-blocking layer 460_3, and a second gate electrode 410_3 may be connected to the second light-blocking layer 460_3. The first switching transistor SCT_3 of FIGS. 30 and 31 is different from the first switching transistor SCT of FIG. 7 in that the second gate electrode 410_3 is connected to the second light-blocking layer 460_3. In the following, redundant descriptions will be omitted, and descriptions will be provided to focus on differences from the above-described contents. For example, the driving transistor in FIG. 31 including the first source electrode 330_3 and the first light-blocking layer 360_3 may be substantially the same as elements 330_2 and 360_2, respectively.

In a display device including the first switching transistor SCT_3 of FIG. 30 and the structure of FIG. 31, a third conductive layer may further include the second light-blocking layer 460_3. The first switching transistor SCT_3 may include a second gate electrode 410_3, a second active layer 450_3, a second source electrode 430_3, a second drain electrode 440_3, and the second light-blocking layer 460_3. The second active layer 450_3 includes a first conductive region 450a_3, second conductive region 450b_3, and channel region 450c_3.

The second light-blocking layer 460_3 is disposed on a first substrate 110. The second light-blocking layer 460_3 may prevent, block, or reduce light, which is from the outside, from being incident on the second active layer 450_3 through the first substrate 110. Lengths of the second light-blocking layer 460_3 in a third direction DR3 and a fourth direction DR4 may be greater than lengths of the second active layer 450_3 in the third direction DR3 and the fourth direction DR4, respectively. The second light-blocking layer 460_3 may be formed as a single layer or multi-layer structure, where each layer may be selected from molybdenum (Mo), aluminum (Al), chromium (Cr), gold (Au), titanium (Ti), nickel (Ni), neodymium (Nd), copper (Cu), and alloys thereof. A buffer layer 120 may be formed on the second light-blocking layer 460_3.

The second gate electrode 410_3 may be in contact with the second light-blocking layer 460_3 through a sixth contact hole CT6. The sixth contact hole CT6 may be formed to expose the second light-blocking layer 460_3 through a first gate insulating layer 130 and the buffer layer 120. In this case, the second light-blocking layer 460_3 and the second gate electrode 410_3, which are disposed below the second active layer 450_3, have the same voltage. For example, the second gate electrode 410_3 may act as an upper gate electrode, and the second light-blocking layer 460_3 may act as a lower gate electrode. Thus, the first switching transistor SCT_3, which acts as a switching transistor, may be driven by a double-gate method so that when the first switching transistor SCT_3 is turned off, leakage current may be reduced or prevented from flowing in a channel region 450c_3 of the second active layer 450_3 of the first switching transistor SCT_3.

Meanwhile, according to some example embodiments, in some of the second switching transistors GPT that are disposed in the non-display area NDA, the active layer may include polysilicon.

FIG. 32 is a plan view illustrating a second switching transistor according to another example embodiment.

Referring to FIG. 32, in a second switching transistor GPT_4 according to an example embodiment, a third active layer 550_4 may include polysilicon. In the following, redundant descriptions will be omitted, and descriptions will be provided to focus on differences from the above-described contents.

The second switching transistor GPT_4 of FIG. 32 includes the third active layer 550_4, a third gate electrode 510_4, a third source electrode 530_4, and a third drain electrode 540_4.

A first semiconductor layer may include the third active layer 550_4 of the second switching transistor GPT_4. The third active layer 550_4 may contain polysilicon and include a first heavily doped region 550a_4, a second heavily doped region 550b_4, a channel region 550c_4, a first lightly doped region 550d_4, and a second lightly doped region 550e_4. The channel region 550c_4 may be made of polysilicon that is not doped with impurities, the first heavily doped region 550a_4 and the second heavily doped region 550b_4 may be made of polysilicon doped with high concentration impurities, and the first lightly doped region 550d_4 and the second lightly doped region 550e_4 may be made of polysilicon doped with low concentration impurities. The third source electrode 530_4 and the third drain electrode 540_4 may be in contact with the first heavily doped region 550a_4 and the second heavily doped region 550b_4, respectively.

A first gate insulating layer 130 is disposed on the third active layer 550_4. The description of the first gate insulating layer 130 is the same as that described above with reference to FIG. 7.

The third gate electrode 510_4 is disposed on the first gate insulating layer 130. The third gate electrode 510_4 may overlap the third active layer 550_4 with the first gate insulating layer 130 interposed therebetween. For example, the third gate electrode 510_4 may overlap the channel region 550c_4 of the third active layer 550_4. The description of the third gate electrode 510_4 is substantially the same as that described above with reference to the first gate electrode 310.

A first interlayer insulating layer 160 is disposed on the third gate electrode 510_4. The first interlayer insulating layer 160 may be formed with a seventh contact hole CT7, which exposes a portion of an upper surface of the third active layer 550_4 through the first interlayer insulating layer 160, and an eighth contact hole CT8, which exposes another portion of the upper surface of the third active layer 550_4 through the first interlayer insulating layer 160. The seventh contact hole CT7 may be formed to expose the first heavily doped region 550a_4 of the third active layer 550_4, and the eighth contact hole CT8 may be formed to expose the second heavily doped region 550b_4 of the third active layer 550_4.

A third conductive layer may include the third source electrode 530_4 and the third drain electrode 540_4. The third source electrode 530_4 is in contact with the first heavily doped region 550a_4, which is formed at one side of the third active layer 550_4, through the seventh contact hole CT7. The third drain electrode 540_4 may be in contact with the second heavily doped region 550b_4, which is formed on the other side of the third active layer 550_4, through the eighth contact hole CT8.

A first protective film 170 is disposed on the third source electrode 530_4 and the third drain electrode 540_4. A first planarizing film 180, which is configured to planarize a step caused by a thin film transistor such as the second switching transistor GPT_4, may be formed on the first protective film 170.

When the third active layer 550_4 of the second switching transistor GPT_4 includes polysilicon, the third active layer 550_4 may have high mobility so that device characteristics of the second switching transistor GPT_4 may be improved. In addition, the third active layer 550_4 may have excellent mobility even when the channel region 550c_4 has a small width so that the area of the non-display area NDA of the display device 1 may be minimized or reduced.

The pull-up transistor TU and the pull-down transistor TD of the scan driver SDR and each of a plurality of transistors of a node controller NC may be formed to be substantially the same as a pull-up transistor TU shown in FIG. 32. In some embodiments, each of the first distribution transistors MT1 and the second distribution transistors MT2 of the data voltage distribution circuit DMUX may be formed to be substantially the same as the second switching transistor GPT_4 shown in FIG. 32.

In a display device according to one example embodiment, each pixel PX can include a driving transistor with a plurality of oxide semiconductors, and a switching transistor with one oxide semiconductor. The driving transistor can include an active layer and an oxide layer that is capable of supplying oxygen to the active layer, and the switching transistor may not include an oxygen supply layer.

Accordingly, the driving transistor can secure a wide range of driving voltages for driving each pixel by additionally including an oxide semiconductor of an oxygen supply layer, and the switching transistor can have high electron mobility in a channel region.

Effects of the present disclosure are not restricted to the example embodiments set forth herein, and more diverse effects are included in this description.

In concluding the detailed description, those skilled in the art will appreciate that many variations and modifications can be made to the described embodiments without substantially departing from the principles of the present disclosure, as set forth in the following claims and their equivalents. Therefore, the disclosed embodiments of the disclosure are used in a generic and descriptive sense only and not for purposes of limitation.

What is claimed is:

1. A display device comprising:
a pixel connected to a scan line and a data line crossing the scan line,
wherein the pixel comprises a light-emitting element, a driving transistor configured to control a driving current supplied to the light-emitting element according to a data voltage applied from the data line, and a first switching transistor configured to apply the data voltage of the data line to the driving transistor according to a scan signal that is applied to the scan line,
the driving transistor comprising a first active layer comprising an oxide semiconductor, and a first oxide layer on the first active layer and comprising an oxide semiconductor, and
the first switching transistor comprising a second active layer comprising an oxide semiconductor,
wherein the first oxide layer is not disposed on the second active layer, and
the first active layer is lower in hydrogen content than the second active layer.

2. The display device of claim 1, wherein the oxide semiconductor of the first active layer and the oxide semiconductor of the second active layer each independently comprise at least one selected from indium (In), gallium (Ga), zinc (Zn), tin (Sn), and hafnium (Hf).

3. The display device of claim 1, wherein the oxide semiconductor of the first oxide layer comprises at least one selected from indium (In), gallium (Ga), zinc (Zn), tin (Sn), and hafnium (Hf).

4. The display device of claim 1, wherein
the first active layer is higher in oxygen content than the second active layer.

5. The display device of claim 1, wherein the driving transistor further comprises:
a first gate insulating layer on the first active layer, and
a first gate electrode on the first gate insulating layer and overlapping the first active layer, and
wherein the first oxide layer is between the first gate electrode and the first gate insulating layer.

6. The display device of claim 5, wherein a width of the first oxide layer, which is measured in one direction, is substantially equal to a width of the first gate electrode, which is measured in the one direction.

7. A display device comprising:
a pixel connected to a scan line and a data line crossing the scan line, the pixel comprising:
a light-emitting element,
a driving transistor configured to control a driving current supplied to the light-emitting element according to a data voltage applied from the data line, and
a first switching transistor configured to apply the data voltage of the data line to the driving transistor according to a scan signal that is applied to the scan line,
the driving transistor comprising:
a first active layer comprising an oxide semiconductor,
a first gate insulating layer on the first active layer,
a first oxide layer on the first gate insulating layer and comprising an oxide semiconductor, and
a first gate electrode on the first oxide layer and overlapping the first active layer,
the first switching transistor comprising a second active layer comprising an oxide semiconductor,
wherein the first oxide layer is not disposed on the second active layer, and
a width of the first oxide layer, which is measured in one direction, is smaller than a width of the first gate electrode, which is measured in the one direction, and both side surfaces of the first oxide layer are in contact with the first gate electrode.

8. The display device of claim 1, wherein the first active layer comprises a first conductive region, a second conductive region, and a channel region between the first conductive region and the second conductive region, and
the first oxide layer overlaps the channel region of the first active layer.

9. The display device of claim 8, wherein the driving transistor further comprises a first source electrode, which is in contact with the first conductive region through a first contact hole that passes through an interlayer insulating layer on the first active layer, and
a first drain electrode, which is in contact with the second conductive region through a second contact hole that passes through the interlayer insulating layer.

10. The display device of claim 9, wherein the driving transistor further comprises a first light-blocking layer below the first active layer, and
the first source electrode is in contact with the first light-blocking layer.

11. The display device of claim 5, wherein the first gate insulating layer is on the second active layer, and
the first switching transistor further comprises a second gate electrode, which is on the first gate insulating layer and overlaps the second active layer.

12. The display device of claim 11, wherein at least a partial region of a lower surface of the first gate electrode is in contact with the first oxide layer, and
 a lower surface of the second gate electrode is not in contact with the first oxide layer.

13. A display device comprising:
 a substrate comprising a display area and a non-display area;
 a buffer layer on the substrate;
 a first semiconductor layer on the buffer layer and comprising an oxide semiconductor, wherein the first semiconductor layer comprises a first active layer and a second active layer in the display area;
 a gate insulating layer on the first semiconductor layer and covering the first active layer and the second active layer;
 a second semiconductor layer on the gate insulating layer and comprising an oxide semiconductor, wherein the second semiconductor layer comprises a first oxide layer on the first active layer;
 a first conductive layer on the second semiconductor layer and comprising a gate electrode;
 an interlayer insulating layer on the first conductive layer and covering the gate electrode; and
 a second conductive layer on the interlayer insulating layer and comprising a source electrode and a drain electrode,
 wherein the first oxide layer is not on the second active layer, and
 the first active layer is lower in hydrogen content than the second active layer.

14. The display device of claim 13, wherein the oxide semiconductor of the first semiconductor layer and the oxide semiconductor of the second semiconductor layer each independently comprise at least one selected from indium (In), gallium (Ga), zinc (Zn), tin (Sn), and hafnium (Hf).

15. The display device of claim 13, wherein
 the first active layer is higher in oxygen content than the second active layer.

16. The display device of claim 13, wherein the first conductive layer further comprises a first gate electrode on the first active layer, the first gate electrode comprising a lower surface that is in contact with the first oxide layer, and
 a second gate electrode on the second active layer, the second gate electrode comprising a lower surface that is in contact with the gate insulating layer.

17. The display device of claim 16, wherein a width of the first gate electrode, which is measured in one direction, is at least equal to a width of the first oxide layer, which is measured in the one direction.

18. The display device of claim 13, wherein the second conductive layer further comprises a first source electrode, which is in contact with one end of the first active layer,
 a first drain electrode, which is in contact with the opposite end of the first active layer,
 a second source electrode, which is in contact with one end of the second active layer, and
 a second drain electrode, which is in contact with the opposite end of the second active layer.

19. The display device of claim 18, further comprising a third conductive layer between the substrate and the buffer layer and comprising a first light-blocking layer overlapping the first active layer,
 wherein the first source electrode is in contact with the first light-blocking layer.

20. The display device of claim 19, wherein the third conductive layer further comprises a second light-blocking layer overlapping the second active layer, and
 a second gate electrode in contact with the second light-blocking layer.

* * * * *